(12) United States Patent
Berdan et al.

(10) Patent No.: US 12,334,951 B2
(45) Date of Patent: Jun. 17, 2025

(54) SEMICONDUCTOR INTEGRATED CIRCUIT AND ARITHMETIC SYSTEM

(71) Applicant: Kioxia Corporation, Tokyo (JP)

(72) Inventors: Radu Berdan, Shinagawa (JP);
Daisuke Miyashita, Kawasaki (JP);
Jun Deguchi, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 883 days.

(21) Appl. No.: 17/469,374

(22) Filed: Sep. 8, 2021

(65) Prior Publication Data

US 2022/0302924 A1 Sep. 22, 2022

(30) Foreign Application Priority Data

Mar. 16, 2021 (JP) .................................. 2021-042572

(51) Int. Cl.
*H03M 1/46* (2006.01)
*G06F 7/544* (2006.01)
*H03M 1/80* (2006.01)

(52) U.S. Cl.
CPC .......... *H03M 1/466* (2013.01); *G06F 7/5443* (2013.01); *H03M 1/462* (2013.01); *H03M 1/804* (2013.01)

(58) Field of Classification Search
CPC .... G06F 17/16; G06F 7/5443; H03M 1/0624; H03M 1/462; H03M 1/466; H03M 1/74; H03M 1/802; H03M 1/804
See application file for complete search history.

(56) References Cited

U.S. PATENT DOCUMENTS

| | | | |
|---|---|---|---|
| 10,476,457 B2 | 11/2019 | Schober et al. | |
| 2019/0386672 A1* | 12/2019 | Seo .................... | H03M 1/1245 |
| 2022/0094368 A1* | 3/2022 | Passamani .......... | H03M 1/0624 |
| 2022/0113942 A1* | 4/2022 | Yen ........................ | H03M 1/74 |

FOREIGN PATENT DOCUMENTS

| | | |
|---|---|---|
| JP | 2009-303042 A | 12/2009 |
| JP | 2011-109562 A | 6/2011 |
| JP | 2019-504585 A | 2/2019 |

OTHER PUBLICATIONS

R. Berdan et al., A u-Controller-Based System for Interfacing Selectorless RRAM Crossbar Arrays, IEEE Transactions on Electron Devices, vol. 62, No. 7, 2015 (Year: 2015).*

* cited by examiner

*Primary Examiner* — Emily E Larocque
(74) *Attorney, Agent, or Firm* — Oblon, McClelland, Maier & Neustadt, L.L.P.

(57) ABSTRACT

According to one embodiment, in a semiconductor integrated circuit, a second switch has a first end connected to a first end of a capacitive element and a second end connected to a node of a reference potential. A third switch has a first end connected to the first end of the capacitive element and a second end connected to an input node of an amplifier circuit. A control circuit maintains the second switch in an on state while maintaining a first and the third switches in an off state in a first period and maintains the first switch in an on state while maintaining the second and third switches in an off state in a second period after the first period. End timings of the second period in the plurality of DA converters are synchronized with each other in response to a signal from a global circuit.

20 Claims, 14 Drawing Sheets

FIG.14A
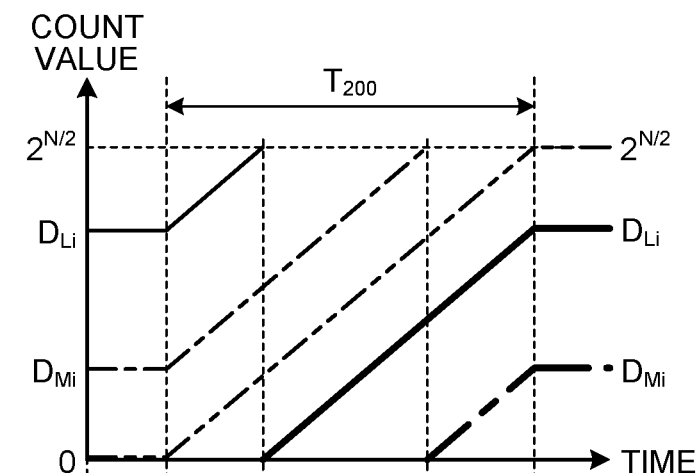
FIG.14B
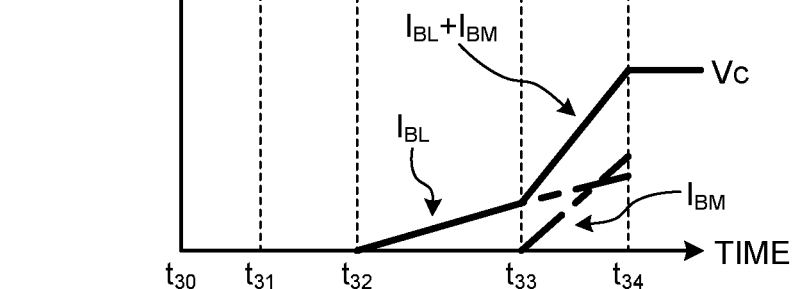
FIG.14C

US 12,334,951 B2

SEMICONDUCTOR INTEGRATED CIRCUIT AND ARITHMETIC SYSTEM

CROSS-REFERENCE TO RELATED APPLICATIONS

This application is based upon and claims the benefit of priority from Japanese Patent Application No. 2021-042572, filed on Mar. 16, 2021; the entire contents of which are incorporated herein by reference.

FIELD

Embodiments described herein relate generally to a semiconductor integrated circuit and an arithmetic system.

BACKGROUND

A semiconductor integrated circuit including a plurality of DA converters is known. Each of the plurality of DA converters converts a digital signal to an analog signal. This signal conversion is called as a DA conversion. It is desirable to improve the conversion accuracy of DA conversion in each DA converter.

BRIEF DESCRIPTION OF THE DRAWINGS

FIGS. 14A to 14C are waveform diagrams illustrating an operation of the DA converter in the fourth embodiment.

DETAILED DESCRIPTION

Figure 1:
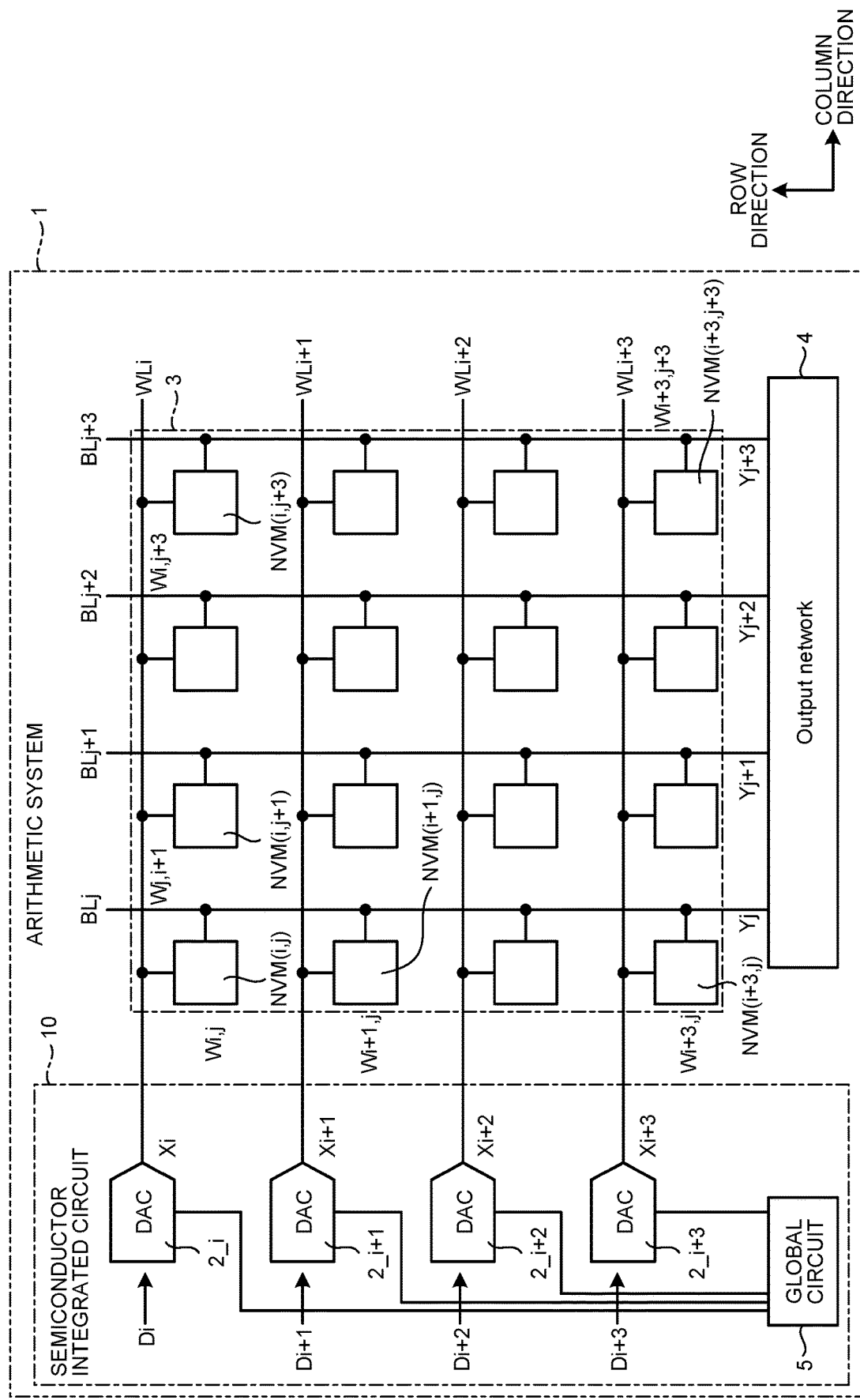
FIG. 1 is a circuit diagram illustrating a configuration of an arithmetic system according to a first embodiment.

In general, according to one embodiment, there is provided a semiconductor integrated circuit including a global circuit and a plurality of DA converters. The plurality of DA converters are connected to the global circuit. Each of the plurality of DA converters includes a current source, a capacitive element, an amplifier circuit, a first switch element, a second switch element, a third switch element, and a control circuit. The capacitive element has a first end and a second end, the second end being connected to a node of a reference potential of the DA converter. The amplifier circuit has an input node. The first switch element has a first end connected to the current source and a second end connected to the first end of the capacitive element. The second switch element has a first end connected to the first end of the capacitive element and a second end connected to the node of the reference potential. The third switch element has a first end connected to the first end of the capacitive element and a second end connected to the input node of the amplifier circuit. The control circuit maintains the second switch element in an on state while maintaining the first switch element and the third switch element both in an off state in a first period, and maintains the first switch element in an on state while maintaining the second switch element and the third switch element both in an off state in a second period after the first period. End timings of the second period in the plurality of DA converters are synchronized with each other in response to a signal received from the global circuit.

Exemplary embodiments of a semiconductor integrated circuit and an arithmetic system will be explained below in detail with reference to the accompanying drawings. The present invention is not limited to the following embodiments.

First Embodiment

An arithmetic system according to a first embodiment includes a circuit block including elements that execute operations, the elements being arranged in a matrix. The circuit block may be used in an application where voltages that can be independent different values are applied, in parallel, to the elements of the respective columns. For example, the arithmetic system according to the first embodiment can be used in an application that executes part of processing of a neural network. The neural network includes a plurality of intermediate layers between an input layer and an output layer. The arithmetic system performs, in parallel, a plurality of neuron calculations in a certain layer in the neural network using a multiply-accumulate operation. The configuration of the multiply-accumulate operation can be implemented by a circuit block including multiplier elements arranged in a matrix.

On an end of each column of the circuit block, a DA converter is arranged. A plurality of DA converters are arrayed along a row direction. Digital signal that is input to each DA converter is converted into analogue signal. The converted analogue signal is input to the circuit block.

For example, as illustrated in FIG. 1, an arithmetic system 1 can be implemented with a circuit configuration using a nonvolatile memory element NVM. FIG. 1 is a circuit diagram illustrating the configuration of the arithmetic system 1.

The arithmetic system 1 includes a semiconductor integrated circuit 10, a circuit block 3, and an output network 4. The semiconductor integrated circuit 10 includes a plurality of DA converters (DAC) $2\_i$ to $2\_i+3$ and a global circuit 5. In the circuit block 3, a plurality of nonvolatile memory elements NVM (i, j) to NVM (i+3, j+3) are arranged in a matrix at positions where a plurality of word lines $WL_i$ to $WL_{i+3}$ intersect a plurality of bit lines $BL_j$ to $BL_{j+3}$, where each of i, j is any natural number. The output network 4 may include any circuits which process outputs of the circuit block 3. Although FIG. 1 exemplifies a case where the circuit block 3 has an array of i-th to (i+3)-th rows and j-th to (j+3)-th columns (the array of 4 rows by 4 columns), the configuration of circuit block 3 is not limited to this array and may have an array of any number of rows and any number of columns. The nonvolatile memory elements NVM (i, j) to NVM (i+3, j+3) function as multiplier elements that multiply received signals by weights $w_{i,\,j}$ to $w_{i+3,\,j+3}$ to generate signals of multiplication results. Although FIG. 1 illustrates, as an example, a case where a multiplier element is the nonvolatile memory element NVM, the multiplier element may be another memory element (e.g., a bit cell of an SRAM) capable of multiplying a signal by a weight. Each of the nonvolatile memory elements NVM (i, j) to NVM (i+3, j+3) has a first end connected to the word line WL and a second end connected to the bit line BL. Resistance states of the nonvolatile memory elements NVM (i, j) to NVM (i+3, j+3) can be set to resistance values corresponding to the weights $w_{i,\,j}$ to $w_{i+3,\,j+3}$. A weight matrix W can be a matrix of i rows and j columns. The weight matrix includes the weights $w_{i,\,j}$ to $w_{i+3,\,j+3}$ as two-dimensional (i.e., i rows×j columns of) elements.

The plurality of DA converters 2_i to 2_i+3 are arranged side by side in the row direction on the column-direction end of the circuit block 3. The plurality of DA converters 2_i to 2_i+3 correspond to the i-th to (i+3)-th rows of the circuit block 3, respectively. The plurality of DA converters 2_i to 2_i+3 DA-convert digital signals $D=(D_i, D_{i+1}, D_{i+2}, D_{i+3})$ to generate word line voltages, as analog signals. The values of the word line voltages of i-th row to (i+3)-th row are, as the analog signals, represented by vector $X=(X_i, X_{i+1}, X_{i+2}, X_{i+3})$. The generated word line voltages of i-th row to (i+3)-th row are applied, in parallel, to the plurality of nonvolatile memory elements NVM (i, j) to NVM (i+3, j+3) as input activation signals (i.e., input analogue signals). The nonvolatile memory elements NVM (i, j) to NVM (i+3, j+3) multiplies the input signal by the weights $w_{i,j}$ to $w_{i+3,j+3}$. Some of the multiplication results are summed up in each column to obtain bit line currents. The values of bit line currents of j-th column to (j+3)-th column are, as output analogue signals, represented by vector $Y=(Y_j, Y_{j+1}, Y_{j+2}, Y_{j+3})$. The bit line currents are supplied to the output network 4. Each of the bit lines $BL_j$ to $BL_{j+3}$ functions as an adder element that adds signals of a plurality of nonvolatile memory elements NVM (i, j) to NVM (i+3, j+3) arranged side by side in the column direction. A resistance value is previously set or reset to the nonvolatile memory element NVM according to a voltage (a set voltage or a reset voltage) applied across the nonvolatile memory element NVM. The weight $w_{i,j}$ to $w_{i+3,j+3}$ depends on the resistance value previously set or reset to the nonvolatile memory element NVM. The vector Y is equal to a result of the multiply-accumulate operation of the vector X×the weight matrix W (Y=X×W).

In the circuit configuration illustrated in FIG. 1, the size of each element (e.g., the nonvolatile memory element NVM) in the circuit block 3 can be reduced to approximately a minimum size limit determined by a manufacture process. In reducing the circuit area of the arithmetic system 1, the circuit area is desirably a small area that enables the DA converters 2 of the respective rows to be arranged at narrow intervals in the row direction while satisfying an operation accuracy required of the DA converters 2 and other performance requirements such as an operation speed. FIG. 1 illustrates an example in which arranging the DA converters 2 at narrow intervals in the row direction is required.

Examples of the configuration of a DA converter include a charge redistribution configuration, a voltage dividing configuration using a resistor, and a current switching configuration. These configurations are not suitable for area-restricted applications where DA converters are arranged at narrow intervals in the row direction.

On the other hand, there may be a configuration of a DA converter including a combination of a higher-order bit circuit that generates a voltage $V_{MSB}$ corresponding to a higher-order bit of a digital value of an input signal and a lower-order bit circuit that generates a voltage $V_{LSB}$ corresponding to a lower-order bit of the digital value of the input signal. The higher-order bit circuit can have the voltage dividing configuration using a resistor because it is sufficient to generate the voltage $V_{MSB}$ corresponding to the higher-order bit with a low accuracy. On the other hand, the lower-order bit circuit can have the charge redistribution configuration to generate the voltage $V_{LSB}$ corresponding to the lower-order bit with a high accuracy. This configuration is applied to an application such as driving of an LED panel. However, the number of elements of a switch element tends to increase. Thus, similarly, this configuration is also not suitable for area-restricted applications where DA converters are arranged at narrow intervals in the column direction.

One method for reducing the area of a DA converter is reducing the size of each element of a circuit. Reducing the size of each element tends to cause variations in the element size and increase a linearity error and a gain error in charge-voltage conversion, which may deteriorate the accuracy of DA conversion.

Another method for reducing the area of a DA converter is improving the circuit configuration to reduce the number of elements constituting a circuit. The number of elements of a DA converter can be reduced by configuring the DA converter so that charges are stored in a capacitive element with a constant current within a time proportional to a value of an input digital signal. A DA converter having this configuration is referred to as a charge-storage-type DA converter.

For example, the charge-storage-type DA converter can include a down counter, a logic circuit, a constant current source, a switch element, a capacitive element, and an amplifier. The switch element has a first end connected to the constant current source, and a second end connected to a first end of the capacitive element and an input node of the amplifier. A second end of the capacitive element is connected to a reference potential (e.g., a ground potential). The down counter starts counting from a value of a digital signal D, decrements the count value in synchronization with a counter clock CLKC, and finishes counting when the count value reaches a minimum value (e.g., zero). The logic circuit receives the count value of the down counter, and outputs an H-level signal to the switch element from the start to finish of counting and outputs an L-level signal to the switch element after the finish of counting. Accordingly, for a time having a length of "value of digital signal D"×"period of counter clock CLKC", the switch element is selectively maintained in an on state, and charges are stored in the first end of the capacitive element with a constant current from the constant current source. As a result, a voltage Vc proportional to the value of the digital signal D is generated in the capacitive element. The voltage Vc is amplified by the amplifier and output as an analog signal X.

In the charge storage DA converter, the accuracy of DA conversion is affected by the accuracy of the current from the constant current source and the accuracy of a capacity of the capacitive element. If the element size of the capacitive element is increased to ensure a sufficient accuracy of the capacity of the capacitive element, the circuit area of the DA converter may be increased. In order to reduce the circuit area, it is desirable to improve the accuracy of DA conversion while keeping the element size of the capacitive element to small.

Figure 2:
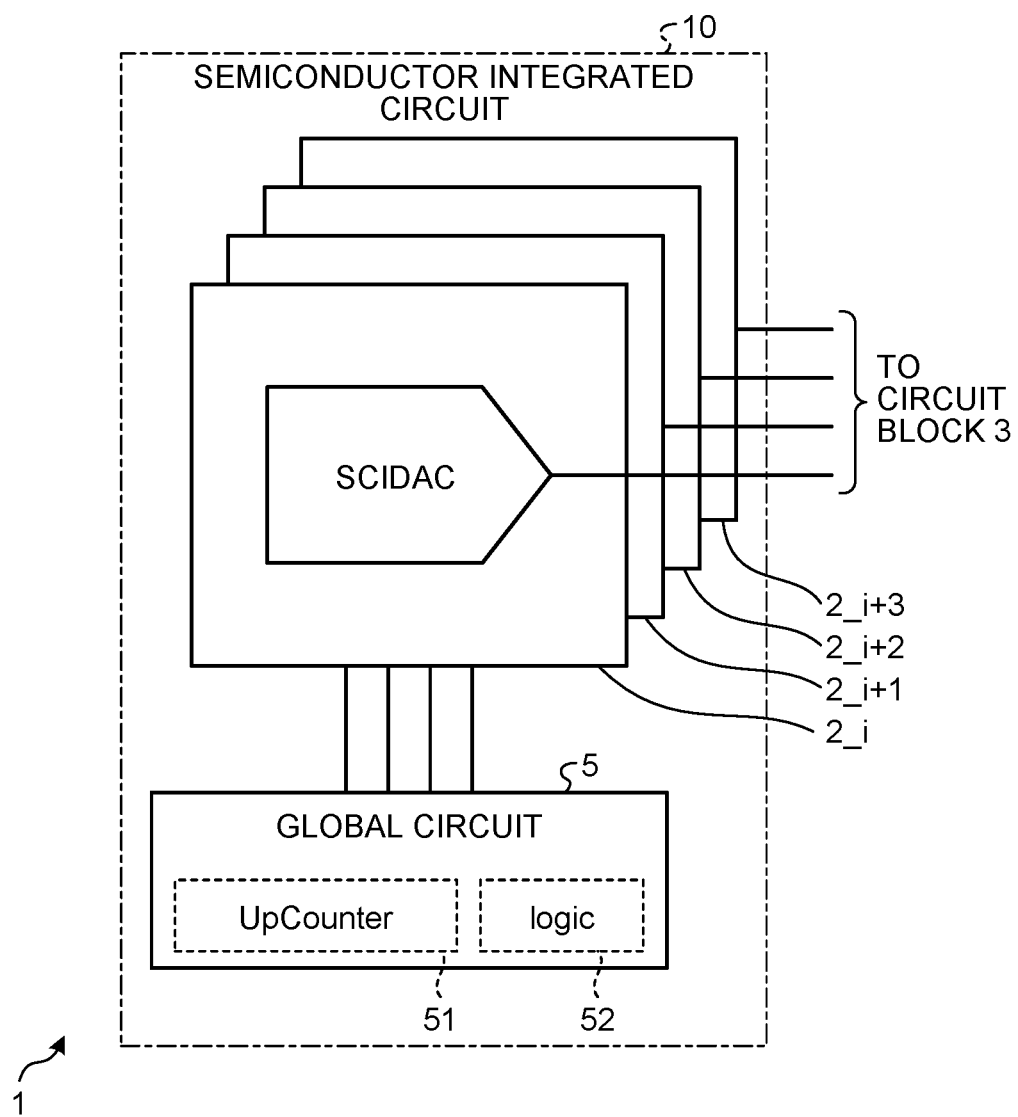
FIG. 2 is a circuit diagram illustrating a configuration of a semiconductor integrated circuit in the first embodiment.

In the arithmetic system 1, the plurality of rows of DA converters 2_$i$ to 2_$i$+3 perform DA conversion independently. Thus, a global circuit 5 as illustrated in FIG. 2 is provided to perform centralized control of operation timings of the plurality of rows of DA converters 2_$i$ to 2_$i$+3. FIG. 2 is a circuit diagram illustrating the global circuit 5 and the plurality of rows of DA converters 2_$i$ to 2_$i$+3. The global circuit 5 is connected to the plurality of rows of DA converters 2_$i$ to 2_$i$+3. The global circuit 5 and the plurality of DA converters 2_$i$ to 2_$i$+3 constitute a part of a semiconductor integrated circuit 10. The semiconductor integrated circuit 10 DA-converts the digital signals D=(D_$i$, D_{$i$+}, D_{$i$+2}, D_{$i$+3}) to generate the word line voltages represented by the vector X=(X_$i$, X_{$i$+1}, X_{$i$+2}, X_{$i$+3}) as analog signals and outputs the generated word line voltages to the circuit block 3.

The global circuit 5 includes a global up counter 51 and a global logic circuit 52. The global circuit 5 generates a counter clock CLKC and supplies the generated counter clock CLKC to the global up counter 51 and each of the DA converters 2.

The global up counter 51 counts from a minimum value to a maximum value in synchronization with the counter clock CLKC. Here, the number of bits of the digital signal D is N. The number of bits of a maximum count value of the global up counter 51 represented as a binary number corresponds to the number of bits of the digital signal D and is, for example, N bits. The minimum value of the global up counter 51 corresponds to a minimum value of the digital signal D and is, for example, zero. The maximum value of the global up counter 51 corresponds to a maximum value of the digital signal D and is, for example, $2^N$. The global logic circuit 52 brings a global start signal GSTART to active level and supplies the global start signal GSTART to each of the DA converters 2 in response to the global up counter 51 starting a count operation from the minimum value.

The global logic circuit 52 brings a global stop signal GSTOP to active level and supplies the global stop signal GSTOP to each of the DA converters 2 in response to the global up counter 51 finishing the count operation when the count value reaches the maximum value. The timing when the global start signal GSTART becomes active level is referred to as the global start timing, and the timing when the global stop signal GSTOP becomes active level is referred to as the global stop timing.

For example, in a case where each of the plurality of rows of DA converters 2 includes a down counter, the DA converters 2 simultaneously start, at the global start timing, their respective count operations from values of the digital signals using the down counters and start the storage of charges in the capacitive elements. The DA converters 2 decrement the count values in synchronization with the common counter clock CLKC, and finish the count operations at timings that may differ from each other when the count values reach the minimum value and finish the storage of charges in the capacitive elements. Then, each of the plurality of rows of DA converters 2 outputs, as the analog signal X, a signal corresponding to a voltage held in the capacitive element at the global stop timing.

A period from the global start timing to the global stop timing is referred to as a conversion period. A period during which the storage of charges in the capacitive element is referred to as a charge storage period. A period from the end timing of the charge storage period to the global stop timing is referred to as an idling period. Regarding a charge leak which is a leak of charges from the capacitive element, the amount of the charge leak in the idling period tends to be larger than the amount of the charge leak in the charge storage period. Thus, as the idling period becomes longer, the amount of the charge leak from the capacitive element increases, and the voltage stored in the capacitive element is more likely to be attenuated. As a result, an error in DA conversion in the DA converter 2 may increase.

The length of the conversion period is the same among the plurality of rows of DA converters 2. When the value of the digital signal to be DA-converted differs among the DA converters 2, the length of the charge storage period differs among the DA converters 2. Thus, the length of the idling period differs among the DA converters 2, which may increase variations of the error in DA conversion. That is, in the entire arithmetic system 1 or the entire semiconductor integrated circuit 10, the error in DA conversion may increase.

Thus, in the present embodiment, the end timings of the charge storage period in the plurality of rows of DA converters 2 are synchronized with each other at the global stop timing to reduce the charge leak, thereby improving the DA conversion accuracy.

Specifically, each of the plurality of rows of DA converters 2 includes a up counter instead of the down counter. Each of the DA converters 2 stops the count operation of the up counter and completes the storage of charges in the capacitive element at the global stop timing. Accordingly, it is possible to reduce the idling period after the end timing of the charge storage period. Thus, it is possible to reduce the error caused by the charge leak, the error being contained in the analog signal, and thus improve the accuracy of DA conversion. Further, since the end timings of the charge storage period in the plurality of DA converters 2 are synchronized with each other, it is possible to reduce variations of the error in DA conversion and reduce the error in DA conversion in the entire arithmetic system 1 or the entire semiconductor integrated circuit 10.

It should be noted that each of the DA converters 2 is a kind of charge-storage-type DA converter having the synchronous end timing of the charge storage period and therefore can be called as a synchronous-charge-integrated-type digital analog converter (SCIDAC).

Figure 3:
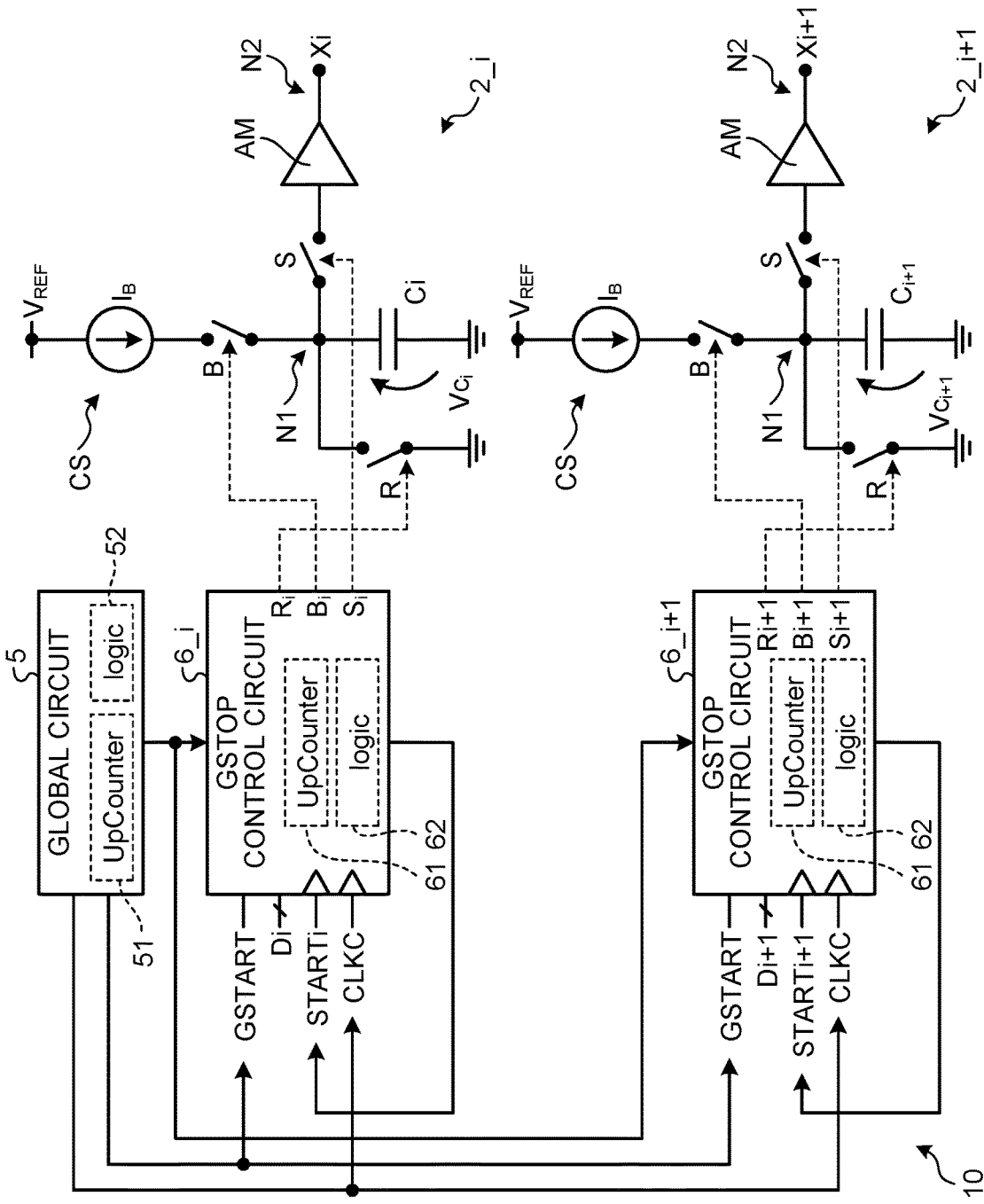
FIG. 3 is a circuit diagram illustrating a configuration of a DA converter (SCIDAC) in the first embodiment.

More specifically, each of the DA converters (SCIDACs) 2 can be configured as illustrated in FIG. 3. FIG. 3 is a circuit diagram illustrating a configuration of the DA converter 2. Although the DA converter 2_$i$ of the i-th row and the DA converter 2_$i$+1 of the (i+1)-th row are illustrated as an example, the DA converter 2_$i$+2 of the (i+2)-th row and the DA converter 2_$i$+3 of the (i+3)-th row can be configured in similar manner to that as illustrated.

The DA converter 2_$i$ of the i-th row is an N-bit DA converter and DA-converts an N-bit digital signal $D_i$ to generate an analog signal $X_i$. The DA converter 2_$i$ includes a current source CS, a capacitive element $C_i$, an amplifier circuit AM, a switch B, a switch R, a switch S, and a control circuit 6_$i$. Each of the switch B, the switch R, and the switch S may be configured with an electrical element such as a transistor.

The current source CS is electrically connected between a voltage $V_{REF}$ and the switch B. The current source CS generates a constant current $I_B$ having a current value equal to a current value of a constant current generated by the current source CS of the other DA converter 2_$i$+1. The current source CS has a first end connected to the voltage $V_{REF}$ and a second end connected to a first end of the switch B.

The capacitive element $C_i$ is capable of generating a voltage corresponding to the amount of stored charges. The capacitive element $C_i$ has a first end electrically connected to a node N1 and a second end electrically connected to a ground potential.

The amplifier circuit AM amplifies a received signal and outputs the amplified signal. The amplifier circuit AM has an input node electrically connected to the node N1 through the switch S and an output node electrically connected to a node N2. The node N2 constitutes an output node of the DA converter 2_$i$ and is electrically connected to the corresponding word line $WL_i$ (refer to FIG. 1) in the circuit block 3.

The switch B is electrically connected between the current source CS and the node N1. The switch B has a first end connected to the current source CS, a second end connected to the node N1, and a control end connected to the control circuit 6_$i$. The switch B is turned on when receiving a control signal Bi of active level from the control circuit 6_$i$ to connect the current source CS to the node N1. The switch B is turned off when receiving the control signal Bi of non-active level from the control circuit 6_$i$ to electrically isolate the current source CS from the node N1.

The switch R is electrically connected between the node N1 and a reference potential. The reference potential is, for example, the ground potential. The switch R has a first end connected to the node N1, a second end connected to the reference potential, and a control end connected to the control circuit 6_$i$. The switch R is turned on when receiving a control signal Ri of active level from the control circuit 6_$i$ to connect the node N1 to the reference potential. Accordingly, charges stored in the capacitive element C are discharged to the reference potential, and the voltage of the capacitive element C is reset. The switch R is turned off when receiving the control signal Ri of non-active level from the control circuit 6_$i$ to electrically isolate the node N1 from the reference potential. Accordingly, the reset of the voltage of the capacitive element C is completed.

The switch S is electrically connected between the node N1 and the amplifier circuit AM. The switch S has a first end connected to the node N1, a second end connected to the amplifier circuit AM, and a control end connected to the control circuit 6_$i$. The switch S is turned on when receiving a control signal Si of active level from the control circuit 6_$i$ to connect the node N1 to the input node of the amplifier circuit AM. Accordingly, the voltage held in the capacitive element $C_i$ is transferred to the amplifier circuit AM and amplified by the amplifier circuit AM. The amplified signal is output as the analog signal $X_i$ to the node N2. The switch S is turned off when receiving the control signal Si of non-active level from the control circuit 6_$i$ to electrically isolate the node N1 from the amplifier circuit AM. Accordingly, the transfer of the voltage held in the capacitive element $C_i$ to the amplifier circuit AM is completed.

The control circuit 6_$i$ receives the digital signal $D_i$ from the outside and receives the global start signal GSTART, the global stop signal GSTOP, and the counter clock CLKC from the global circuit 5. The control circuit 6_$i$ generates a local start signal $START_i$, the control signal $R_i$, the control signal $B_i$, and the control signal $S_i$ in response to the digital signal $D_i$, the global start signal GSTART, the global stop signal GSTOP, and the counter clock CLKC.

The control circuit 6_$i$ includes a local up counter 61 and a local logic circuit 62. The number of bits of a maximum count value of the local up counter 61 represented as a binary number corresponds to the number of bits of the digital signal $D_i$ and is, for example, N bits. A minimum value of the local up counter 61 corresponds to a minimum value of the digital signal D and is, for example, zero. A maximum value of the local up counter 61 corresponds to a maximum value of the digital signal D and is, for example, $2^N$. The local up counter 61 is connected to the global circuit 5. The local up counter 61 receives the digital signal $D_i$ from the outside and receives the global start signal GSTART, the global stop signal GSTOP, and the counter clock CLKC from the global circuit 5. The local up counter 61 performs a count operation in response to the global start signal GSTART, the global stop signal GSTOP, and the counter clock CLKC. The local logic circuit 62 generates the local start signal $START_i$, the control signal $R_i$, the control signal $B_i$, and the control signal $S_i$ according to the count value of the local up counter 61.

The control circuit 6_$i$ supplies the control signal $R_i$, the control signal $B_i$, and the control signal $S_i$ to the control end of the switch R, the control end of the switch B, and the control end of the switch S, respectively. Accordingly, the control circuit 6_$i$ controls the switch R, the switch B, and the switch S.

A configuration of the DA converter 2_$i$+1 is basically similar to the configuration of the DA converter 2_$i$ as illustrated in FIG. 3. Thus, description thereof will be omitted.

Next, an operation of the semiconductor integrated circuit 10 will be described. In the semiconductor integrated circuit 10, the following operations (1) to (5) are performed.

(1) First, an initialization process is performed. In the DA converters 2_$i$ to 2_$i$+3 of the respective rows, the switches R are turned on with the switches B and the switches S maintained in an off state, and the voltages $Vc_i$ to $Vc_{i+3}$ held in the capacitive elements $C_i$ to $C_{i+3}$ are reset to zero. Further, the count value of the global up counter 51 is set to the minimum value, and values of the digital signals $D_i$ to $D_{i+3}$ are set as initial values of the local up counters 61 of the control circuits 6_$i$ to 6_$i$+3.

(2) Next, a DA conversion process is started. The global up counter 51 and the local up counters 61 of the respective rows simultaneously start counting up in synchronization with the counter clock CLKC having a frequency $f_{CLKC}$.

(3) In each of the DA converters 2_$i$ to 2_$i$+3 of the respective rows, when the count value of the local up counter 61 reaches the maximum value (e.g., $2^N$), the switch R is turned off and the switch B is turned on, and the storage of charges in the corresponding one of the capacitive elements $C_i$ to $C_{i+3}$ is started.

(4) When the count value of the global up counter 51 reaches the maximum value (e.g., $2^N$), the DA conversion process is finished. That is, in the DA converters 2_$i$ to 2_$i$+3 of all rows, the switches B are turned off, and the storage of charges in the capacitive elements $C_i$ to $C_{i+3}$ is finished. Accordingly, a voltage represented by the following formula 1 is held in the capacitive element C of each of the DA converters 2.

$$V_{C_K} = \frac{I_B D_K}{f_{CLKC} C} \qquad \text{Formula 1}$$

In formula 1, k is a row number, and k=i to i+3. $D_k$ is a digital signal input to the DA converter 2_$k$ of the k-th row and has a bit pattern of N bits. $I_B$ is a current value of the current source $CS_k$. $f_{CLKC}$ is the frequency of the counter clock CLKC. C is a capacitance value of the capacitive element $C_k$.

(5) When the DA conversion process is finished, in the DA converters $2\_i$ to $2\_i+3$ of all rows, the switches B are turned off and the switches S are turned on, and the voltages of the capacitive elements $C_i$ to $C_{i+3}$ are amplified and output as the analog signals $X_i$ to $X_{i+3}$.

Figure 4A:
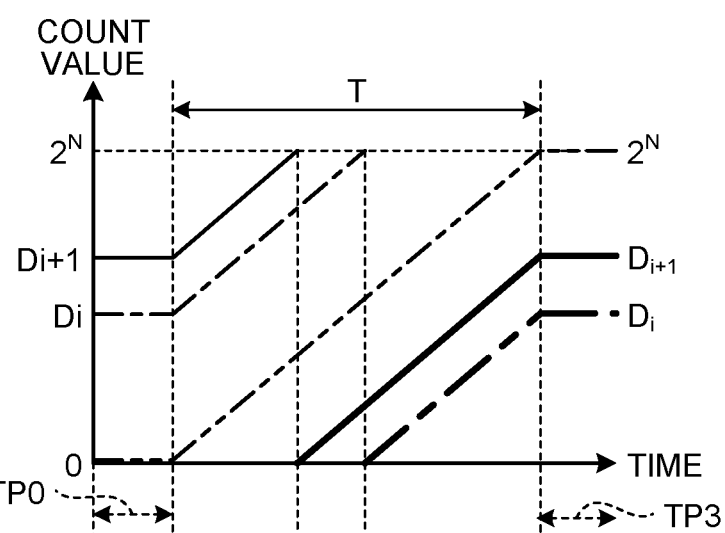
FIGS. 4A to 4C are waveform diagrams illustrating an operation of the semiconductor integrated circuit in the first embodiment.
Figure 4B:
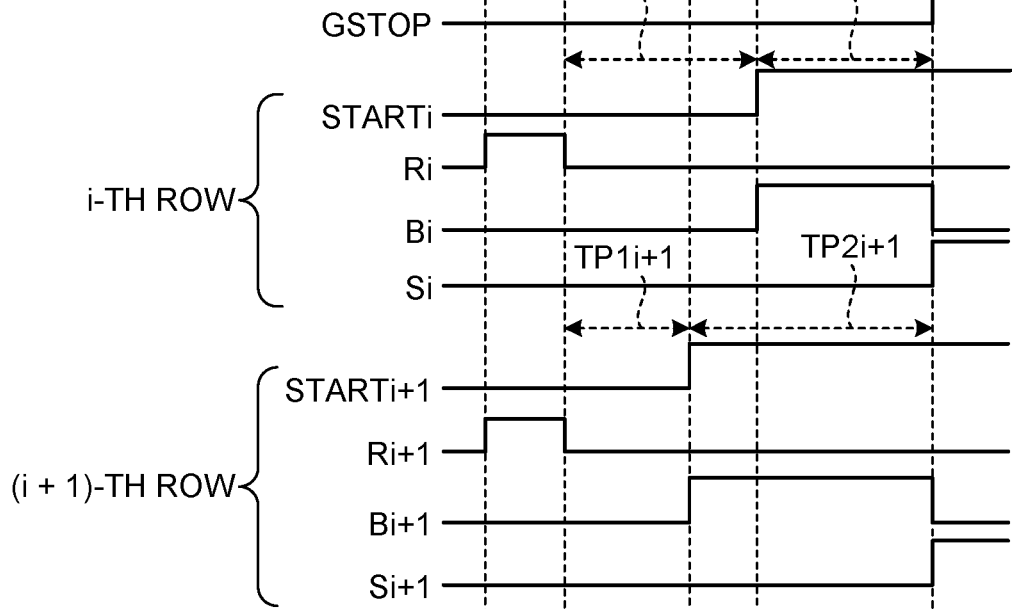
Figure 4C:
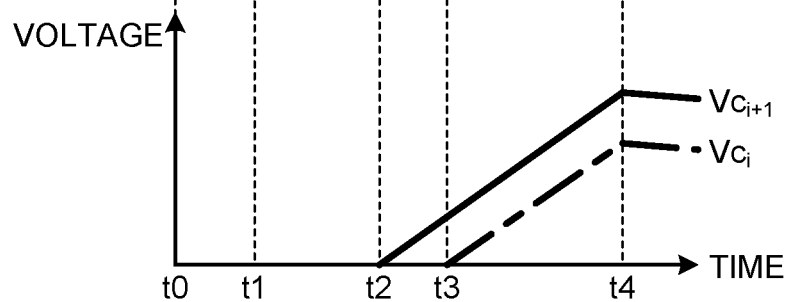

For example, the semiconductor integrated circuit 10 operates as illustrated in FIGS. 4A to 4C. FIGS. 4A to 4C illustrate, as an example, operations of the global circuit 5, and the DA converter $2\_i$ of the i-th row and the DA converter $2\_i+1$ of the (i+1)-th row. FIG. 4A illustrates count values of the global up counter 51 and the local up counter 61 of each row. FIG. 4B illustrates level transition timings of the global start signal GSTART, the global stop signal GSTOP, and the local start signals $START_i$ and $START_{i+1}$ and the control signals $R_i$, $R_{i+1}$, $B_i$, $B_{i+1}$, $S_i$, $S_{i+1}$ of the i-th and (i+1)-th rows. FIG. 4C illustrates the voltages $V_{Ci}$ and $V_{Ci+1}$ stored in the capacitive elements $C_i$ and $C_{i+1}$.

Immediately before timing t0, the global circuit 5 sets the minimum value (e.g., zero) to the global up counter 51, the control circuit $6\_i$ of the i-th row sets a value of the digital signal $D_i$ to the local up counter 61, and the control circuit $6\_i+1$ of the (i+1)-th row sets a value of the digital signal $D_{i+1}$ to the local up counter 61.

At this time, the local logic circuit 52 of the i-th row supplies, to the switch R, the switch B, and the switch S, the control signal $R_i$, the control signal $B_i$, and the control signal $S_i$ which are maintained at non-active level. Accordingly, the switch R, the switch B, and the switch S are all maintained in an off state in the DA converter $2\_i$. The local logic circuit 52 of the (i+1)-th row supplies, to the switch R, the switch B, and the switch S, the control signal $R_{i+1}$, the control signal $B_{i+1}$, and the control signal $S_{i+1}$ which are maintained at non-active level. Accordingly, the switch R, the switch B, and the switch S are all maintained in an off state in the DA converter $2\_i+1$.

At the timing t0, the local logic circuit 62 of the i-th row causes the control signal $R_i$ to transition from non-active level to active level. Accordingly, the switch R is turned on in the DA converter $2\_i$. The local logic circuit 62 of the (i+1)-th row causes the control signal $R_{i+1}$ to transition from non-active level to active level. Accordingly, the switch R is turned on in the DA converter $2\_i+1$.

In a period TP0 from the timing t0 to timing t1, the local logic circuit 62 of the i-th row maintains the control signal $R_i$ at active level while maintaining the control signal $B_i$ and the control signal $S_i$ at non-active level. Accordingly, in the DA converter $2\_i$, the switch R is maintained in an on state while the switch B and the switch S are maintained in an off state, charges stored in the capacitive element $C_i$ are discharged, and the voltage of the capacitive element $C_i$ is reset. The local logic circuit 62 of the (i+1)-th row maintains the control signal $R_{i+1}$ at active level while maintaining the control signal $B_{i+1}$ and the control signal $S_{i+1}$ at non-active level. Accordingly, in the DA converter $2\_i+1$, the switch R is maintained in an on state while the switch B and the switch S are maintained in an off state, charges stored in the capacitive element $C_{i+1}$ are discharged, and the voltage of the capacitive element $C_{i+1}$ is reset.

At the timing t1, the global up counter 51 starts counting up from the minimum value as indicated by a chain double-dashed line in FIG. 4A. In response to this, the global logic circuit 52 causes the global start signal GSTART to transition from non-active level to active level as illustrated in FIG. 4B. The global logic circuit 52 supplies the global start signal GSTART to the local up counter 61 of the i-th row and the local up counter 61 of the (i+1)-th row. In response to the global start signal GSTART becoming active level, the local up counter 61 of the i-th row starts counting up from a value of the digital signal $D_i$ as indicated by a dot-dash line in FIG. 4A. In response to the global start signal GSTART becoming active level, the local up counter 61 of the (i+1)-th row starts counting up from a value of the digital signal $D_{i+1}$ as indicated by a solid line in FIG. 4A. The global up counter 51, the local up counter 61 of the i-th row, and the local up counter 61 of the (i+1)-th row count up in synchronization with the counter clock CLKC.

At the timing t1, the local logic circuit 52 of the i-th row causes the control signal $R_i$ to transition from active level to non-active level. Accordingly, in the DA converter $2\_i$, the switch R is turned off, and the reset of the voltage of the capacitive element $C_i$ is completed. The local logic circuit 62 of the (i+1)-th row causes the control signal $R_{i+1}$ to transition from active level to non-active level. Accordingly, in the DA converter $2\_i+1$, the switch R is turned off, and the reset of the voltage of the capacitive element $C_{i+1}$ is completed.

Focusing on the DA converter $2\_i$, in a period $TP1_i$ from the timing t1 to timing t3, the local up counter 61 of the i-th row counts up in synchronization with the counter clock CLKC as indicated by the dot-dash line in FIG. 4A. In the period $TP1_i$, the local logic circuit 62 of the i-th row maintains the control signal $R_i$, the control signal $B_i$, and the control signal $S_i$ at non-active level. Accordingly, in the DA converter $2\_i$, the switch R, the switch B, and the switch S are maintained in an off state.

As indicated by the dot-dash line in FIG. 4A, when the count value of the local up counter 61 of the i-th row reaches the maximum value at the timing t3, the control circuit $6\_i$ resets the count value of the local up counter 61 from the maximum value to the minimum value. In addition, the control circuit $6\_i$ causes the local start signal $START_i$ of the i-th row to transition from non-active level to active level. In response to this, the local up counter 61 of the i-th row starts counting up from the minimum value as indicated by the dot-dash line in FIG. 4A. The local up counter 61 of the i-th row counts up in synchronization with the counter clock CLKC.

In response to the local start signal $START_i$ becoming active level, the local logic circuit 62 of the i-th row changes the control signal $B_i$ from non-active level to active level while maintaining the control signal $R_i$ and the control signal $S_i$ at non-active level. The local logic circuit 62 of the i-th row supplies the control signal $R_i$, the control signal $S_i$, and the control signal $B_i$ to the switch R, the switch S, and the switch B, respectively. Accordingly, in the DA converter $2\_i$, the switch B is turned on while the switch R and the switch S are maintained in an off state, and the storage of charges in the capacitive element $C_i$ is started.

In a period $TP2_i$ from the timing t3 to timing t4, as indicated by the dot-dash line in FIG. 4A, the local up counter 61 of the i-th row counts up in synchronization with the counter clock CLKC. In the period $TP2_i$, the local logic circuit 62 of the i-th row maintains the control signal $B_i$ at active level while maintaining the control signal $R_i$ and the control signal $S_i$ at non-active level. Accordingly, in the DA converter $2\_i$, the switch B is maintained in an on state while the switch R and the switch S are maintained in an off state, and the storage of charges in the capacitive element $C_i$ is performed.

On the other hand, focusing on the DA converter $2\_i+1$, in a period $TP1_{i+1}$ from the timing t1 to timing t2, the local up counter 61 of the (i+1)-th row counts up in synchronization with the counter clock CLKC as indicated by the solid line in FIG. 4A. In the period $TP1_{i+1}$, the local logic circuit 62 of the (i+1)-th row maintains the control signal $R_{i+1}$, the control signal $B_{i+1}$, and the control signal $S_{i+1}$ at non-active level. Accordingly, in the DA converter 2_i+1, the switch R, the switch B, and the switch S are maintained in an off state.

As indicated by the solid line in FIG. 4A, when the count value of the local up counter 61 of the (i+1)-th row reaches the maximum value at the timing t2, the control circuit 6_i+1 resets the count value of the local up counter 61 from the maximum value to the minimum value. In addition, the control circuit 6_i+1 causes the local start signal $START_{i+1}$ of the (i+1)-th row to transition from non-active level to active level. In response to this, the local up counter 61 of the (i+1)-th row starts counting up from the minimum value as indicated by the solid line in FIG. 4A. The local up counter 61 of the (i+1)-th row counts up in synchronization with the counter clock CLKC.

In response to the local start signal $START_{i+1}$ becoming active level, the local logic circuit 62 of the (i+1)-th row changes the control signal $B_{i+1}$ from non-active level to active level while maintaining the control signal $R_{i+1}$ and the control signal $S_{i+1}$ at non-active level. The local logic circuit 62 of the (i+1)-th row supplies the control signal $R_{j+1}$, the control signal $S_{j+1}$, and the control signal $B_{i+1}$ to the switch R, the switch S, and the switch B, respectively. Accordingly, in the DA converter 2_i+1, the switch B is turned on while the switch R and the switch S are maintained in an off state, and the storage of charges in the capacitive element $C_{i+1}$ is started.

In a period $TP2_{i+1}$ from the timing t2 to the timing t4, as indicated by the solid line in FIG. 4A, the local up counter 61 of the (i+1)-th row counts up in synchronization with the counter clock CLKC. In the period $TP2_{i+1}$, the local logic circuit 62 of the (i+1)-th row maintains the control signal $B_{i+1}$ at active level while maintaining the control signal $R_{i+1}$ and the control signal $S_{i+1}$ at non-active level. Accordingly, in the DA converter 2_i+1, the switch B is maintained in an on state while the switch R and the switch S are maintained in an off state, and the storage of charges in the capacitive element $C_{i+1}$ is performed.

At the timing t4, as indicated by the chain double-dashed line in FIG. 4A, the count value of the global up counter 51 reaches the maximum value. In response to this, as illustrated in FIG. 4B, the global logic circuit 52 causes the global stop signal GSTOP to transition from non-active level to active level. The global logic circuit 52 supplies the global stop signal GSTOP to the local up counter 61 of the i-th row and the local up counter 61 of the (i+1)-th row. In response to the global stop signal GSTOP becoming active level, the local up counter 61 of the i-th row finishes counting up, for example, at a value of the digital signal $D_i$ as indicated by the dot-dash line in FIG. 4A. In response to the global stop signal GSTOP becoming active level, the local up counter 61 of the (i+1)-th row finishes counting up, for example, at a value of the digital signal $D_{i+1}$ as indicated by the solid line in FIG. 4A.

At this time, the local logic circuit 52 of the i-th row causes the control signal $B_i$ to transition from active level to non-active level and causes the control signal $S_i$ to transition from non-active level to active level. Accordingly, in the DA converter 2_i, the switch R is turned off to complete the storage of charges in the capacitive element $C_i$, and the voltage of the capacitive element $C_i$ is output to the amplifier circuit AM. The local logic circuit 52 of the (i+1)-th row causes the control signal $B_{i+1}$ to transition from active level to non-active level and causes the control signal $S_{i+1}$ to transition from non-active level to active level. Accordingly, in the DA converter 2_i+1, the switch B is turned off to complete the storage of charges in the capacitive element $C_{i+1}$, and the voltage of the capacitive element $C_{i+1}$ is output to the amplifier circuit AM.

In a period TP3 after the timing t4, the local logic circuit 62 of the i-th row maintains the control signal $S_i$ at active level while maintaining the control signal $R_i$ and the control signal $B_i$ at non-active level. Accordingly, in the DA converter 2_i, the switch S is maintained in an on state while the switch R and the switch B are maintained in an off state, and the voltage of the capacitive element $C_i$ is amplified by the amplifier circuit AM and output as the analog signal $X_i$. The local logic circuit 62 of the (i+1)-th row maintains the control signal $S_{i+i}$ at active level while maintaining the control signal $R_{i+1}$ and the control signal $B_{i+1}$ at non-active level. Accordingly, in the DA converter 2_i+1, the switch S is maintained in an on state while the switch R and the switch B are maintained in an off state, and the voltage of the capacitive element $C_{i+1}$ is amplified by the amplifier circuit AM and output as the analog signal $X_{i+1}$.

A period T illustrated in FIG. 4A is a period from the global start timing t1 to the global stop timing t4. The period T is a conversion period during which DA conversion is performed and common between the i-th row and the (i+1)-th row. That is, the conversion period T is common among the plurality of rows of DA converters 2_i to 2_i+3.

The period $TP2_i$ and the period $TP2_{i+1}$ are a charge storage period of the i-th row and a charge storage period of the (i+1)-th row, respectively. Start timings of the periods $TP2_i$ and $TP2_{i+1}$ are t3 and t2, respectively, and not synchronized with each other. That is, start timings of the charge storage period TP2 in the plurality of rows of DA converters 2_i to 2_i+3 are not synchronized with each other.

End timings of the periods $TP2_i$ and $TP2_{i+1}$ are synchronized with the global stop timing t4. That is, end timings of the charge storage period TP2 in the plurality of rows of DA converters 2_i to 2_i+3 are synchronized with each other.

As illustrated in FIG. 4C, the voltage $V_C$ of the capacitive element C in each row starts rising from an initial value (e.g., zero) at the time that varies depending on a value of the input digital signal D and stops rising at the time that is the same among the capacitive elements C of the respective rows. The voltage $V_C$ of each capacitive element C starts attenuating after the voltage $V_C$ stops rising. However, according to the first embodiment, after the rise of the voltage $V_C$ of the capacitive element C stops, the analog signal X can be output at a point in time when the amount of the attenuation of the voltage $V_C$ is still small. Thus, the attenuation of the analog signal caused by the charge leak can be reduced. That is, compared to the DA conversion method in which charges are stored in the first half of the conversion period T, and the second half thereof serves as the idling period, it is possible to shorten a time lag among the finish of the storage of charges and the output of the analog signal and reduce the error caused by the charge leak in the analog signal.

As described above, in the first embodiment, the end timings of the charge storage period in the plurality of rows of DA converters 2 are synchronized with the global stop timing. This enables each of the DA converters 2 to reduce the error caused by the charge leak in the analog signal. Thus, the accuracy of DA conversion can be improved.

Second Embodiment

Next, an arithmetic system 1a according to a second embodiment will be described. Hereinbelow, differences from the first embodiment will be mainly described. The arithmetic system 1a according to the second embodiment includes a semiconductor integrated circuit 110 including a plurality of DA converters 102.

In the first embodiment, the charge-storage-type DA converter (SCIDAC) 2 having the synchronous end timing of the charge storage period can be configured with a small number of elements. Thus, the circuit area thereof can be easily reduced. Further, in order to reduce the circuit area of the DA converter 2, it is effective to reduce the size of each element. For example, it is effective to reduce the sizes of the capacitive element C and the current source CS.

However, if the sizes of the capacitive element C and the current source CS in the DA converter 2 are reduced, an increase rate of the voltage $V_C$ of the capacitive element C in the charge storage period tends to vary. Thus, as the sizes of the capacitive element C and the current source CS are reduced, the increase rate of the voltage Vc of the capacitive element C in the charge storage period tends to deviate from an appropriate increase rate, which may increase the error in DA conversion in the DA converter 2.

The appropriate increase rate of the voltage $V_C$ of the capacitive element C in the charge storage period is the same among the plurality of rows of DA converters 2. If the increase rate of the voltage $V_C$ of the capacitive element C in the charge storage period varies among the DA converters 2 of the respective rows, variations in the analog signal X corresponding to the voltage Vc of the capacitive element C tend to increase among the plurality of rows of DA converters 2. Thus, in the entire arithmetic system 1 or the entire semiconductor integrated circuit 10, the error in DA conversion may increase.

The variations in the increase rate of the voltage $V_C$ of the capacitive element C in the charge storage period may occur due to the influences of both variations in a value of the current passed by the current source CS from row to row and variations in the capacitance value of the capacitive element C from row to row. For example, in the DA converter of a certain row, if the capacitance value of the capacitive element C is larger than a particular capacitance value and the current value of the current source CS is smaller than a particular current value, the increase rate of the voltage $V_C$ of the capacitive element C in the charge storage period may become smaller than the appropriate increase rate. On the other hand, in the DA converter of a certain row, if the capacitance value of the capacitive element C is smaller than the particular capacitance value and the current value of the current source CS is larger than the particular current value, the increase rate of the voltage $V_C$ of the capacitive element C in the charge storage period may become larger than the appropriate increase rate.

It can be considered that, in order to reduce the error in DA conversion in each of the DA converters 2 to reduce operation variations among the plurality of DA converters 2, it is effective to make the increase rate of the voltage Vc of the capacitive element C in the charge storage period substantially equal to the appropriate increase rate in each of the plurality of DA converters 2. At this time, even if the current value of the current source is made substantially equal among the plurality of rows of DA converters 2, the increase rate of the voltage $V_C$ of the capacitive element C may deviate from the appropriate increase rate due to variations in the capacitance value of the capacitive element C among the plurality of rows of DA converters 2. Thus, a mechanism for reducing variations in both the current value of the current source and the capacitance value of the capacitive element C among the plurality of rows of DA converters 2 is required.

Based on such a consideration, in the second embodiment, a global circuit 5 generates a reference voltage corresponding to the appropriate increase rate, and the DA converter 102 of each row corrects the current value of the current source according to the reference voltage to achieve the appropriate increase rate of the voltage Vc of the capacitive element C in the charge storage period.

Figure 5:
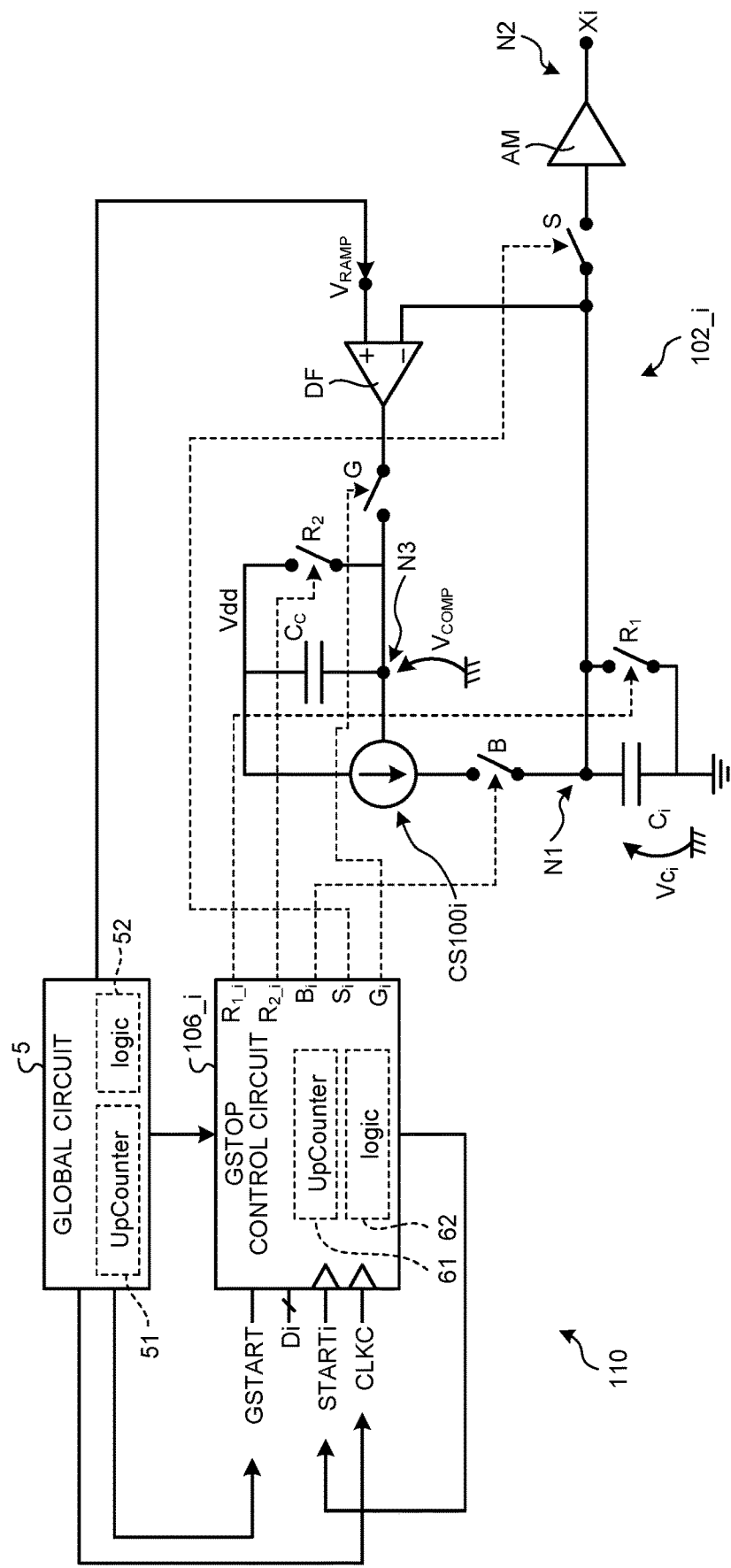
FIG. 5 is a circuit diagram illustrating a configuration of a DA converter in a second embodiment.

Specifically, the DA converter 102 of each row in the semiconductor integrated circuit 110 can be configured as illustrated in FIG. 5. FIG. 5 is a circuit diagram illustrating a configuration of the DA converter (SCIDAC) 102. Although FIG. 5 illustrates a configuration of the DA converter 102_i of the i-th row as an example, the similar points are applicable to the DA converters 102_i+1 to 102_i+3 of the other rows.

The DA converter 102_i includes a variable current source CS100i, a control circuit 106_i, a switch R1, and a switch R2 instead of the current source CS, the control circuit 6_i, and the switch R (refer to FIG. 3). The DA converter 102_i further includes a capacitive element $C_C$, a differential amplifier circuit DF, and a switch G. Each of the switch R1, the switch R2, and the switch G may be configured with an electrical element such as a transistor.

The variable current source CS100i is capable of changing a current to be passed toward a capacitive element $C_i$ and capable of changing a change rate of a voltage $V_C$ of the capacitive element $C_i$ during charge storage. The variable current source CS100i is electrically connected among a power supply potential Vdd, a switch B, and a node N3. The variable current source CS100i has a first end connected to the power supply potential Vdd, a second end connected to a first end of the switch B, and a control end connected to the node N3. The variable current source CS100i generates a current having a current value corresponding to a voltage $V_{COMP}$ of the node N3.

The switch R1 is capable of resetting the voltage of the capacitive element $C_i$ by being turned on. The switch R1 is connected in parallel to the capacitive element $C_i$ between a node N1 and a reference potential. The switch R1 has a first end connected to the node N1 and a second end connected to the reference potential. The reference potential is, for example, a ground potential.

The switch R2 is capable of resetting the voltage of the capacitive element $C_C$ by being turned on. The switch R2 is connected in parallel to the capacitive element Cc between the control end of the current source CS100i and the power supply potential Vdd. The switch R2 has a first end connected to the control end of the current source CS100i and a second end connected to the power supply potential Vdd.

The capacitive element $C_C$ is a capacitive element for compensation. The capacitive element $C_C$ holds a voltage for adjusting the voltage $V_{COMP}$ of the node N3 and holds, for example, a voltage corresponding to the difference between the power supply potential Vdd and the voltage $V_{COMP}$ of the node N3. The capacitive element $C_C$ is connected in parallel to the switch R2 between the control end of the current source CS100i and the power supply potential Vdd. The capacitive element $C_C$ has a first end connected to the control end of the current source CS100i and a second end connected to the power supply potential Vdd.

The differential amplifier circuit DF amplifies and outputs the difference between a voltage $V_{Ci}$ of the capacitive element $C_i$ and a reference voltage $V_{RAMP}$. The differential amplifier circuit DF has a non-inverting input node that receives the reference signal $V_{RAMP}$ from the global circuit 5, an inverting input node connected to the node N1, and an output node connected to a first end of the switch G.

The switch G is capable of connecting the output node of the differential amplifier circuit DF to the node N3 by being turned on. The switch G is connected between the differential amplifier circuit DF and the node N3. The switch G has the first end connected to the output node of the differential amplifier circuit DF and a second end connected to the node N3.

When the control circuit 106_i receives a signal indicating compensation from the global circuit 5, the control circuit 106_i causes a control signal $B_i$ and a control signal $G_i$ to transition from non-active level to active level while maintaining a control signal $R_1\_i$, a control signal $R_2\_i$, and a control signal $S_i$ at non-active level. Accordingly, the switch G and the switch B are selectively turned on, and a feedback loop of the output node of the differential amplifier circuit DF→the node N3→the variable current source CS100i→the node N1→the inverting input node of the differential amplifier circuit DF is formed. Thus, the DA converter 102_i adjusts the voltage $V_{COMP}$ of the node N3 according to the difference between the reference signal $V_{RAMP}$ and the voltage $V_{Ci}$. The variable current source CS100i supplies, to the node N1, a current corresponding to the adjusted voltage $V_{COMP}$ to store charges in the capacitive element $C_i$. That is, the DA converter 102_i monitors the voltage $V_{Ci}$ of the capacitive element $C_i$ while storing charges in the capacitive element $C_j$ and corrects the current value of the variable current source CS100i according to the difference between the voltage $V_{Ci}$ of the capacitive element $C_i$ and the reference voltage $V_{RAMP}$ to perform feedback control. This makes it possible to bring the change rate of the voltage $V_{Ci}$ of the capacitive element $C_i$ close to a conversion rate of the reference voltage $V_{RAMP}$.

It should be noted that the reference signal $V_{RAMP}$ may be generated in such a manner that, in the global circuit 5, a global up counter 51 counts up from a minimum value (e.g., zero) in synchronization with a counter clock CLKC, and a global logic circuit 52 generates the reference signal $V_{RAMP}$ according to a count value of the global up counter 51. For example, the global logic circuit 52 generates the reference signal $V_{RAMP}$ having a voltage value corresponding to the multiplication of the count value of the global up counter 51 by a factor. The global logic circuit 52 supplies the generated reference signal $V_{RAMP}$ to the differential amplifier circuit DF of each row.

Figure 6:
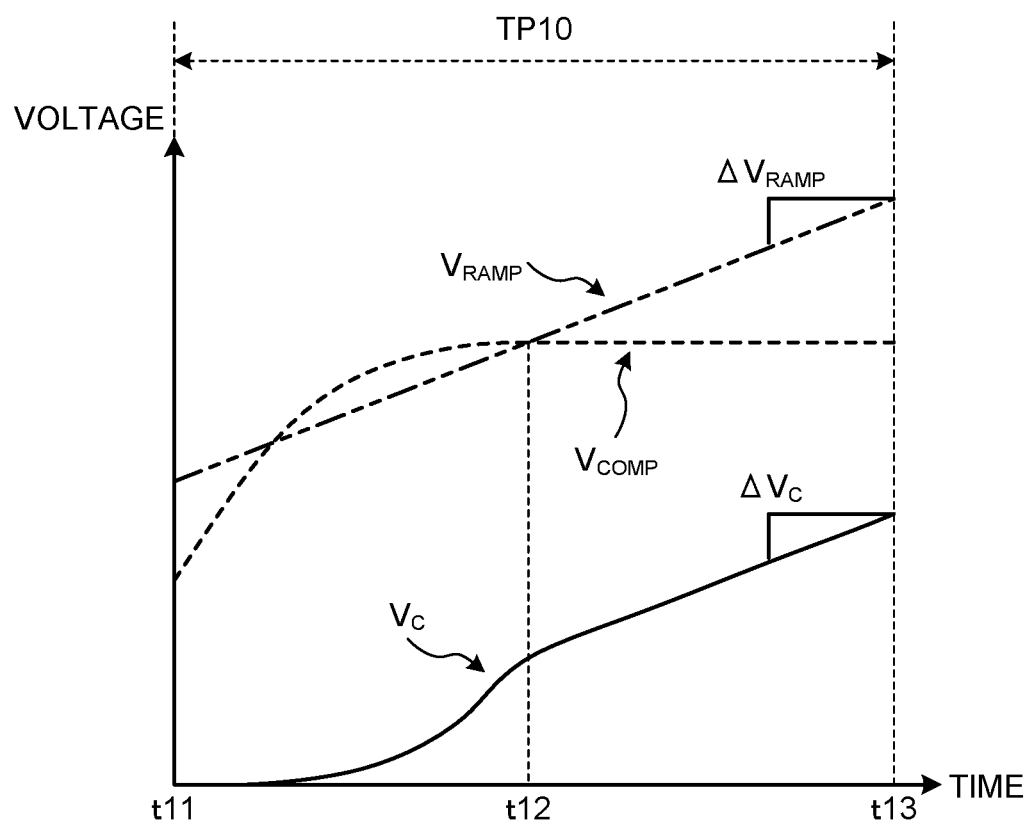
FIG. 6 is a waveform diagram illustrating a compensation of the DA converter in the second embodiment.

Next, the compensation for the change rate of the voltage $V_C$ of the capacitive element C in the DA converter 102 of each row will be described with reference to FIG. 6. FIG. 6 is a waveform diagram illustrating the compensation of the DA converter 102. A period TP10 of the compensation illustrated in FIG. 6 may be provided before a period of DA conversion (e.g., the period T illustrated in FIG. 4A).

As mentioned above, an object of the compensation is to bring the change rate of the voltage $V_C$ of the capacitive element C close to (e.g., substantially equal to) the appropriate change rate in the DA converters 102 of all rows taking into consideration both variations in the capacitance value of the capacitive element C and variations in the current value of the variable current source CS100. In the compensation, the global reference voltage $V_{RAMP}$ is used. The global reference voltage $V_{RAMP}$ is a reference voltage having a ramp-like (saw-like) waveform and serves as a reference for the change rate of the voltage $V_C$ of the capacitive element C in the DA converters 102 of all rows.

In the period of the compensation, the DA converter 102_i illustrated in FIG. 5 feedback-controls the voltage $V_{COMP}$ so that the change rate of the voltage $V_{Ci}$ of the capacitive element $C_i$ approaches the change rate of the reference voltage $V_{RAMP}$ and corrects the current value of the variable current source CS100i using the voltage $V_{COMP}$. In the DA converter 102_i, the voltages of the capacitive element $C_i$ and the capacitive element Cc are reset by turning on the switch R1 and the switch R2. The feedback loop of the output node of the differential amplifier circuit DF→the node N3→the variable current source CS100i→the node N1→the inverting input node of the differential amplifier circuit DF is formed by turning on the switch B and the switch G after turning off the switch R1 and the switch R2. At this time, the reference voltage $V_{RAMP}$ is supplied to the non-inverting input node of the differential amplifier circuit DF, and feedback control is performed so that the change rate of the voltage $V_{Ci}$ of the capacitive element $C_i$ approaches the change rate of the reference voltage $V_{RAMP}$. A transfer function f of the differential amplifier circuit DF is represented by the following formula 2.

$$f(V_{RAMP}-V_C)-V_S-K(V_{RAMP}-V_C)=V_{COMP} \qquad \text{Formula 2}$$

In formula 2, Vs denotes an offset voltage of the differential amplifier circuit DF. K is a positive amplification factor larger than zero. In this case, the change rate of the voltage $V_{COMP}$ of the node N3 is represented by the following formula 3.

$$\frac{dV_{COMP}}{d(V_{RAMP}-V_C)} = -K, K>0 \qquad \text{Formula 3}$$

A transfer function g of the variable current source CS100 with respect to the voltage $V_{COMP}$ of the node N3 is given by the following formula 4.

$$g(V_{COMP})=A-BV_{COMP}=I, B>0 \qquad \text{Formula 4}$$

In formula 4, A denotes an offset current of the variable current source CS100. B is a positive transconductance gain larger than zero. The change rate of the voltage Vc of the capacitive element C and the change rate of the reference voltage $V_{RAMP}$ are represented by the following formula 5.

$$\frac{dV_C}{dt} = \Delta V_C,$$

$$\frac{dV_{RAMP}}{dt} = \Delta V_{RAMP} \qquad \text{Formula 5}$$

When C denotes the capacitance value of the capacitive element C, the change rate $\Delta Vc$ of the voltage Vc of the capacitive element C can be represented by $\Delta Vc = I/C$ using a current I of the variable current source CS100. Thus, the following formula 6 is derived from formulae 3 to 5.

$$\frac{dV_{COMP}}{dt} = a - bV_{COMP} \qquad \text{Formula 6}$$

Formula 6 is a differential equation for the voltage $V_{COMP}$. In formula 6, substitutions represented by formula 7 are performed on a and b.

$$a = -K\Delta V_{RAMP} + \frac{KA}{C},$$
$$b = \frac{KB}{C}$$

Formula 7

A solution for the voltage $V_{COMP}$ can be obtained as represented by the following formula 8 by solving the differential equation of formula 6.

$$V_{COMP} = \frac{\pm e^{-b(t-c)} + a}{b}$$

Formula 8

From formulae 3 and 4, b in formula 8 is a positive value larger than zero. From formula 8, the voltage $V_{COMP}$ converges to a/b in time as represented by the following formula 9.

$$\lim_{t \to \infty} V_{COMP} = \frac{a}{b} = \frac{A - \Delta V_{RAMP} C}{B}$$

Formula 9

Here, the following formula 10 holds from formulae 4 and 5.

$$\frac{dV_C}{dt} = \Delta V_C = \frac{I}{C} = \frac{A - BV_{COMP}}{C}$$

Formula 10

From formulae 9 and 10, the change rate $\Delta V_C$ of the voltage Vc of the capacitive element C converges to $\Delta V_{RAMP}$ in time as represented by the following formula 11.

$$\lim_{t \to \infty} \frac{dV_C}{dt} = \frac{A - B\left(\frac{A - \Delta V_{RAMP} C}{B}\right)}{C} = \Delta V_{RAMP}$$

Formula 11

As represented by formula 11, the value $\Delta V_{RAMP}$ to which the change rate $\Delta V_C$ converges is a global value independent of the current value I of the variable current source and the capacitance value C of the capacitive element $V_C$ of each row. Thus, the change rate $\Delta V_C$ of the voltage $V_C$ of the capacitive element C can be equalized among the DA converters 102 of the respective rows and brought to an appropriate value by performing the compensation of the present embodiment.

For example, in the case of FIG. 6, in response to start of the period TP10 of the compensation at timing t11, the DA converter 102 turns on the switch G and the switch B with the switch R1, the switch R2, and the switch S maintained in an off state. Accordingly, the feedback loop of the output node of the differential amplifier circuit DF→the node N3→the variable current source CS100→the node N1→the inverting input node of the differential amplifier circuit DF is formed.

In a period from the timing t11 to timing t12, the DA converter 102 performs feedback operation so that the variable current source CS100$i$ supplies a current to the node N1 to store charges in the capacitive element $C_i$ at the voltage $V_{COMP}$ of the node N3 corresponding to the difference between the reference signal $V_{RAMP}$ and the voltage $V_{Ci}$. Accordingly, the voltage $V_{COMP}$ approaches the value shown in formula 9, and the change rate of the voltage $V_{Ci}$ of the capacitive element $C_i$ approaches $\Delta V_{RAMP}$ shown in formula 10.

When the voltage $V_{COMP}$ reaches the value shown in formula 9 at the timing t12, the change rate of the voltage $V_{Ci}$ of the capacitive element $C_i$ becomes substantially equal to $\Delta V_{RAMP}$.

In a period from the timing t12 to timing t13, the voltage $V_{COMP}$ is maintained substantially at the value shown in formula 9, and the change rate of the voltage $V_{Ci}$ of the capacitive element Ci is maintained substantially at $\Delta V_{RAMP}$.

In response to end of the period TP10 of the compensation at the timing t13, the DA converter 102 turns off the switch G. Accordingly, the voltage $V_{COMP}$ is maintained substantially at the value shown in formula 9 by the capacitive element Cc for compensation. Thus, the current value of the variable current source CS100 is also maintained as it is.

As described above, in the second embodiment, in the semiconductor integrated circuit 110, the global circuit 5 generates the reference voltage $V_{RAMP}$ corresponding to the appropriate increase rate, and the DA converter 102 of each row corrects the current value of the current source according to the reference voltage $V_{RAMP}$. Accordingly, regardless of variations in the current value of the variable current source CS100 and variations in the capacitance value of the capacitive element C, it is possible to bring the increase rate of the voltage $V_C$ of the capacitive element C in the charge storage period close to the appropriate value. That is, in the DA converter 102 of each row, it is possible to reduce the sizes of the variable current source CS100 and the capacitive element C and achieve the appropriate increase rate of the voltage $V_C$ of the capacitive element C in the charge storage period.

As illustrated in FIG. 5, the DA converter 102 of each row includes the configuration of the DA converter 2 of each row in the first embodiment. Thus, the DA converter 102 of each row can perform DA conversion after the compensation described in the second embodiment as with the first embodiment. In this case, the variable current source CS100 can pass a current with the adjusted current value, and the voltage $V_C$ of the capacitive element C in the charge storage period can increase at the appropriate increase rate. Thus, the accuracy of DA conversion can be further improved.

Third Embodiment

Next, an arithmetic system 1$b$ according to a third embodiment will be described. Hereinbelow, differences from the first embodiment and the second embodiment will be mainly described. The arithmetic system 1$b$ according to the third embodiment includes a semiconductor integrated circuit 210 including a plurality of DA converters 202.

Figure 7:
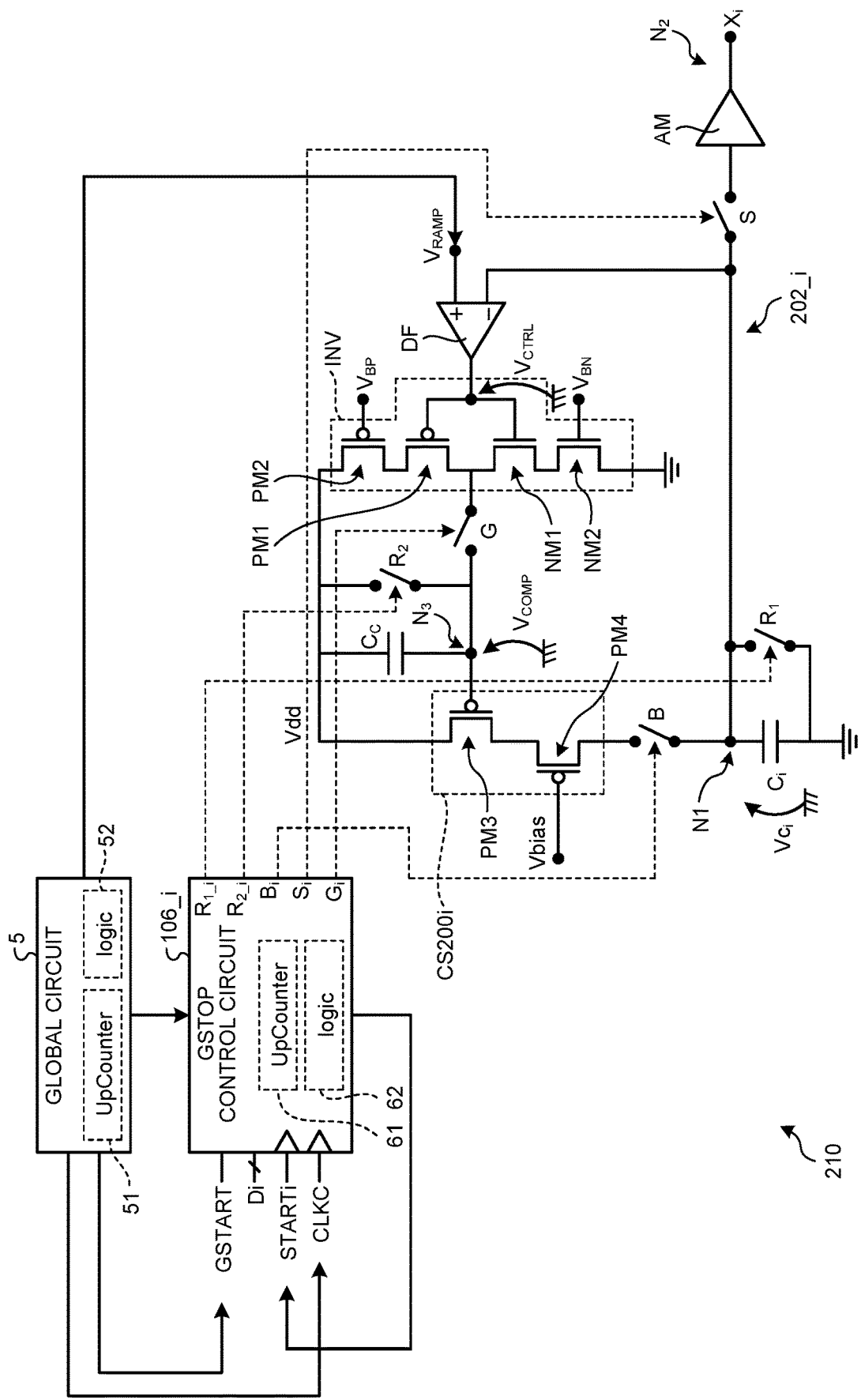
FIG. 7 is a circuit diagram illustrating a configuration of a DA converter in a third embodiment.

In the third embodiment, an implementation form of the semiconductor integrated circuit 110 of the second embodiment will be described as an example. Specifically, each of the DA converters 202 in the semiconductor integrated circuit 210 can be configured as illustrated in FIG. 7. FIG. 7 is a circuit diagram illustrating a configuration of the DA converter (SCIDAC) 202 in the third embodiment. Although FIG. 7 illustrates a configuration of the DA converter 202_$i$ of the i-th row as an example, the same applies to the DA converters 202_$i$+1 to 202_$i$+3 of the other rows.

The DA converter 202_i includes a variable current source CS200i instead of the variable current source CS100i (refer to FIG. 5) and further includes an inverter INV.

The variable current source CS200i varies a current value by passing a constant current and adding its variation thereto. The variable current source CS200i includes a combination of a constant current source and a variable current source. The variable current source CS200i includes series connection of a transistor PM3 and a transistor PM4 between a power supply potential Vdd and a switch B. Although FIG. 7 illustrates the configuration in which the transistor PM3 is disposed at the power supply potential Vdd side and the transistor PM4 is disposed at the switch B side, the transistor PM4 may be disposed at the power supply potential Vdd side and the transistor PM3 may be disposed at the switch B side The transistor PM3 is, for example, a PMOS transistor and has a source connected to the power supply potential Vdd, a drain connected to the transistor PM4, and a gate connected to a node N3. A voltage $V_{COMP}$ of the node N3 is variable in response to a feedback operation of the DA converter 202_i, and the transistor PM3 can function as the variable current source. The transistor PM4 is, for example, a PMOS transistor and has a source connected to the transistor PM3, a drain connected to the switch B, and a gate that receives a bias voltage Vbias. The bias voltage Vbias has a fixed potential, and the transistor PM4 can function as the constant current source.

The inverter INV is capable of forming a current path from the power supply potential Vdd to the node N3 or a current path from the node N3 to GND with a switch G maintained in an on state. Accordingly, a start current in performing the storage of charges for compensation in a capacitive element Cc can be supplied to the node N3 in a state where a switch R2 is turned off to complete reset of the voltage of the capacitive element Cc.

The inverter INV drives a signal output from a differential amplifier circuit DF and transmits the driven signal to the node N3 with the switch G maintained in an on state. Accordingly, it is possible to transmit, at high speed, a change in the level of the signal output from the differential amplifier circuit DF to the node N3 and increase the speed of a feedback operation when a feedback loop of an output node of the differential amplifier circuit DF→the node N3→the variable current source CS200i→a node N1→an inverting input node of the differential amplifier circuit DF is formed.

The inverter INV logically inverts the level of the signal output from the differential amplifier circuit DF and transmits the level-inverted signal to the node N3 with the switch G maintained in an on state. At this time, the inverter INV generates the signal using the power supply potential Vdd and a ground potential. Thus, the inverter INV can generate the signal with reduced influence of an offset component contained in the signal output from the differential amplifier circuit DF.

The inverter INV has an input node connected to the differential amplifier circuit DF, an output node connected to the switch G, a power supply node connected to the power supply potential Vdd, and a reference node connected to the ground potential.

The inverter INV includes a transistor PM1 and a transistor NM1 that are inverter-connected between the differential amplifier circuit DF and the switch G. The transistor PM1 is, for example, a PMOS transistor and has a source connected to a transistor PM2, a drain connected to the transistor NM1 and the switch G, and a gate connected to the differential amplifier circuit DF. The transistor NM1 is, for example, an NMOS transistor and has a source connected to a transistor NM2, a drain connected to the transistor PM1 and the switch G, and a gate connected to the differential amplifier circuit DF.

The inverter INV further includes the transistor PM2 between the transistor PM1 and the power supply potential Vdd and the transistor NM2 between the transistor NM1 and the ground potential. The transistor PM2 is, for example, a PMOS transistor and has a source connected to the power supply potential Vdd, a drain connected to the transistor PM1, and a gate that receives a bias voltage $V_{BP}$. The bias voltage $V_{BP}$ has a fixed potential, and the transistor PM2 can function as the constant current source. The transistor NM2 is, for example, an NMOS transistor and has a source connected to the ground potential, a drain connected to the transistor NM1, and a gate that receives a bias voltage $V_{DN}$. The bias voltage $V_{DN}$ has a fixed potential, and the transistor NM2 can function as the constant current source. The configuration of the inverter INV is commonly known as a "starved inverter".

Figure 8:
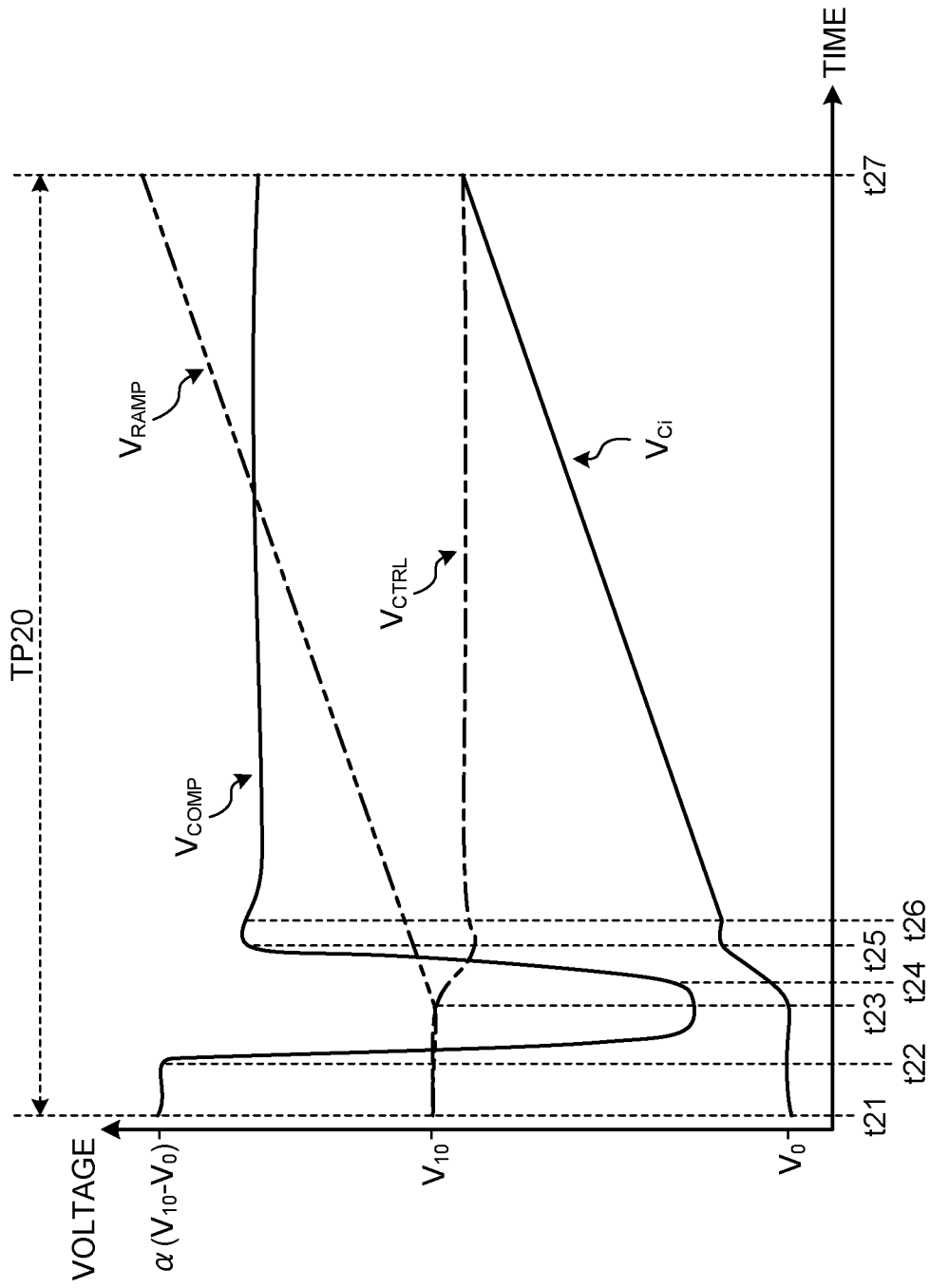
FIG. 8 is a waveform diagram illustrating an operation of the DA converter in the third embodiment.

Next, compensation for a change rate of a voltage $V_{Ci}$ of a capacitive element $C_i$ in the DA converter 202 of each row will be described with reference to FIG. 8. FIG. 8 is a waveform diagram illustrating the compensation of the DA converter 202. A period TP20 of the compensation illustrated in FIG. 8 can be provided before a period of DA conversion (e.g., the period T illustrated in FIG. 4).

In the DA converter 202_i illustrated in FIG. 7, the configuration including the combination of the differential amplifier circuit DF and the inverter INV has a transfer function f obtained by replacing $V_C$ with $V_{Ci}$ in formula 2 and substituting Vs≈0 into formula 2. In a state where the feedback loop is formed, the inverter INV drives the capacitive element $C_C$ for compensation and adjusts the voltage $V_{COMP}$ of the node N3. Accordingly, the current source CS200i operates with a transfer function similar to the transfer function g of formula 4 and passes a current to the capacitive element $C_C$ to store charges therein. At this time, for example, since the transistors PM2, NM2, and PM4 function as the constant current sources, the feedback operation through the feedback loop can be performed at high speed. Accordingly, the change rate of the voltage $V_C$ of the capacitive element C can be equalized among the DA converters 202 of the respective rows and brought to an appropriate value at high speed.

For example, in the case of FIG. 8, immediately before timing t21, the switch R1 is maintained in an on state and the voltage of the capacitive element $C_i$ is reset, and the switch R2 is maintained in an on state and the voltage of the capacitive element $C_C$ is reset. Accordingly, the potential of the node N1 is substantially equal to the ground potential, and the potential of the node N3 is substantially equal to the power supply potential Vdd. The transistor PM3 is off.

Figure 9:
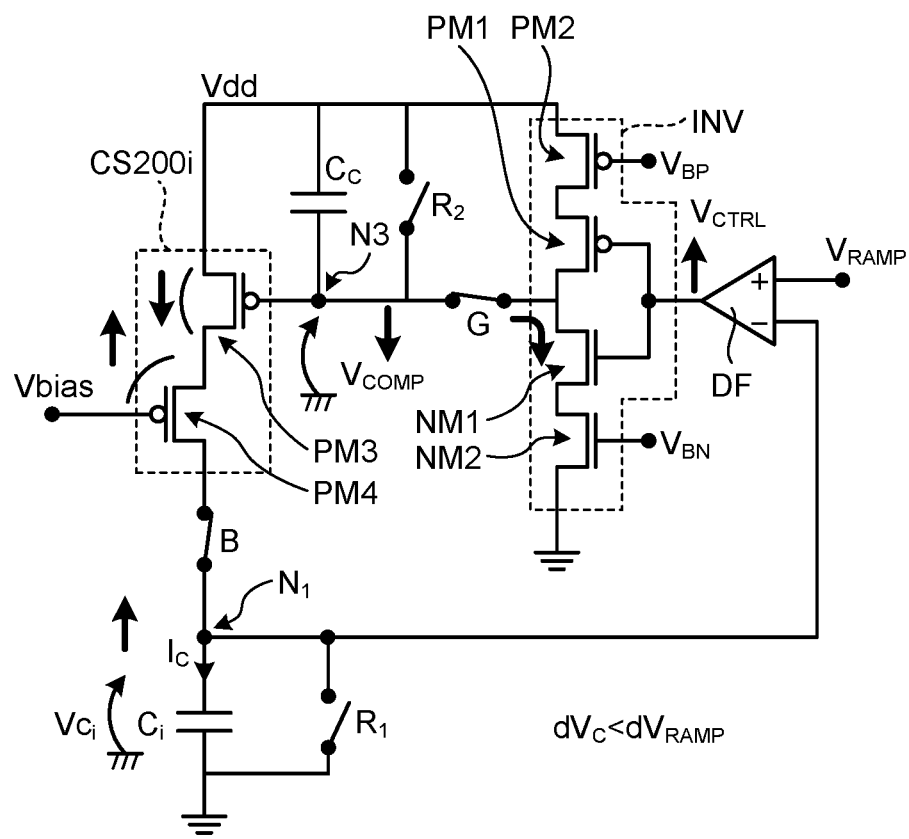
FIG. 9 is a circuit diagram illustrating an operation of the DA converter in the third embodiment.

At the timing t21, in response to start of the period TP20 of the compensation, the DA converter 202 turns on the switch G and the switch B with the switch R1, the switch R2, and the switch S maintained in an off state. Accordingly, as illustrated in FIG. 9, a feedback loop of the output node of the differential amplifier circuit DF→the inverter INV→the node N3→the variable current source CS200i→the node N1→the inverting input node of the differential amplifier circuit DF is formed. FIG. 9 is a circuit diagram illustrating an operation of the DA converter 202.

At timing t22 of FIG. 8, the differential amplifier circuit DF amplifies the difference between an initial value V10 of the reference voltage $V_{RAMP}$ and an initial value V0 of the voltage Vci and outputs a voltage $V_{CTRL}=\alpha\times(V_{RAMP}-Vci)=\alpha\times(V10-V0)$. In response to the voltage $V_{CTRL}$ exceeding a threshold of the inverter INV, the transistor PM1 is turned off, and the transistor NM1 is turned on. Accordingly, as indicated by thick arrows in FIG. 9, charges at the first end of the capacitive element $C_C$ are discharged to the ground potential through the node N3, the switch G, the transistor NM1, and the transistor NM2, which may rapidly reduce the voltage $V_{COMP}$ of the node N3.

At timing t23, the transistor PM3 is turned on, and the variable current source CS200i starts the supply of current to the capacitive element $C_i$. The global circuit 5 experimentally obtains a time Δt substantially equal to a time from the timing t21 to the timing t23 and stores the time Δt as a parameter in advance. The global circuit 5 starts increasing the reference voltage $V_{RAMP}$ from the initial value V10 in response to an elapse of the time Δt from the start of the period T20 of the compensation. Accordingly, as indicated by the thick arrows in FIG. 9, the voltage $V_{Ci}$ of the capacitive element $C_i$ starts rapidly increasing.

After that, a change rate $dV_C$ of the voltage $V_{Ci}$ becomes larger than a change rate $dV_{RAMP}$ of the reference voltage $V_{RAMP}$, and the difference $(V_{RAMP}-V_{Ci})$ between the reference voltage $V_{RAMP}$ and the voltage $V_{Ci}$ decreases. In response to this, the voltage $V_{CTRL}=\alpha\times(V_{RAMP}-Vci)$ output from the differential amplifier circuit DF decreases.

Figure 10:
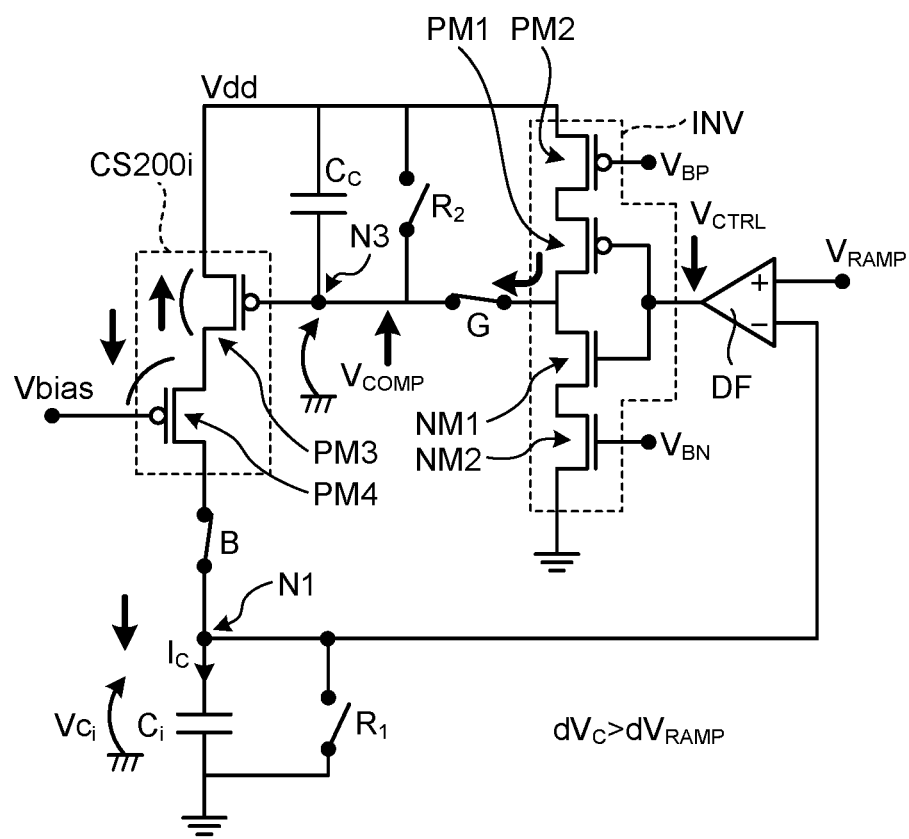
FIG. 10 is a circuit diagram illustrating an operation of the DA converter in the third embodiment.

At timing t24, in response to the Voltage $V_{CTRL}$ falling below the threshold of the inverter INV, the transistor PM1 is turned on, and the transistor NM1 is turned off. Accordingly, as indicated by thick arrows in FIG. 10, the current flows from the power supply potential Vdd into the first end of the capacitive element Cc through the transistor PM2, the transistor PM1, the switch G, and the node N3 to store charges in the capacitive element Cc, which may rapidly increase the voltage $V_{COMP}$ of the node N3. FIG. 10 is a circuit diagram illustrating the operation of the DA converter 202.

At timing t25 of FIG. 8, the current passed by the transistor PM3 is reduced. Thus, the variable current source CS200i reduces a current value of the current to the capacitive element $C_i$. In response to this, the change rate $dV_C$ of the voltage $V_{Ci}$ becomes smaller than the change rate $dV_{RAMP}$ of the reference voltage VRAMP, and, as illustrated in FIG. 9, the voltage $V_{CTRL}=\alpha\times(V_{RAMP}-V_{Ci})$ output from the differential amplifier circuit DF increases.

When the change rate $dV_C$ of the voltage $V_{Ci}$ becomes substantially equal to the change rate $dV_{RAMP}$ of the reference voltage $V_{RAMP}$ at timing t26, the voltage $V_{CTRL}$ output from the differential amplifier circuit DF becomes stable at a substantially constant value. In response to this, the voltage $V_{COMP}$ of the node N3 becomes stable at a substantially constant value, and the variable current source CS200i starts supplying a current having an appropriate current value to the capacitive element $C_i$.

In a period from the timing t26 to timing t27, the variable current source CS200i continuously and stably supplies the current having the appropriate current value to the capacitive element $C_i$.

Figure 11:
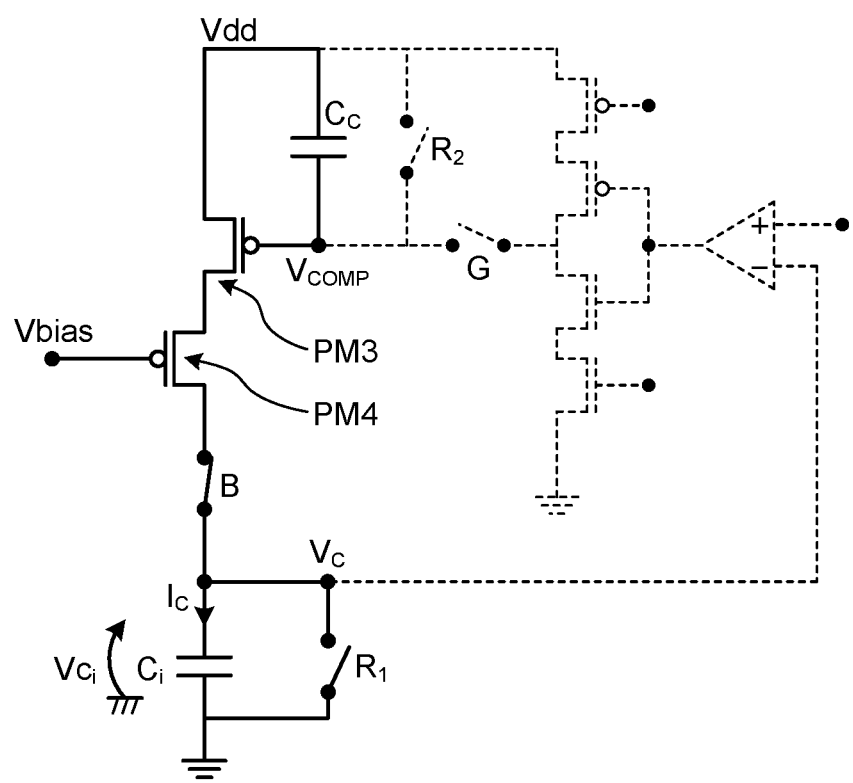
FIG. 11 is a circuit diagram illustrating an operation of the DA converter in the third embodiment.

When the period T20 of the compensation ends at timing t27, the DA converter 202 turns off the switch G. Accordingly, the feedback loop is interrupted, the voltage $V_{COMP}$ is maintained at the corrected value with charges held in the capacitive element $C_C$, and the variable current source CS200i is brought into a state capable of continuously supplying the current having the appropriate current value to the capacitive element $C_i$. As a result, as illustrated in FIG. 11, in the charge storage period, the switch $R_1$, the switch $R_2$, and the switch G are maintained in an off state, and the switch B is maintained in an on state. At this time, the variable current source CS200i supplies the current having the appropriate current value to the capacitive element $C_i$ according to the voltage $V_{COMP}$ maintained at the corrected value. That is, charges are stored in the capacitive element $C_i$ with the current having the appropriate current value. This makes it possible to increase the voltage $V_{Ci}$ of the capacitive element $C_i$ at an appropriate increase rate.

Figure 12:
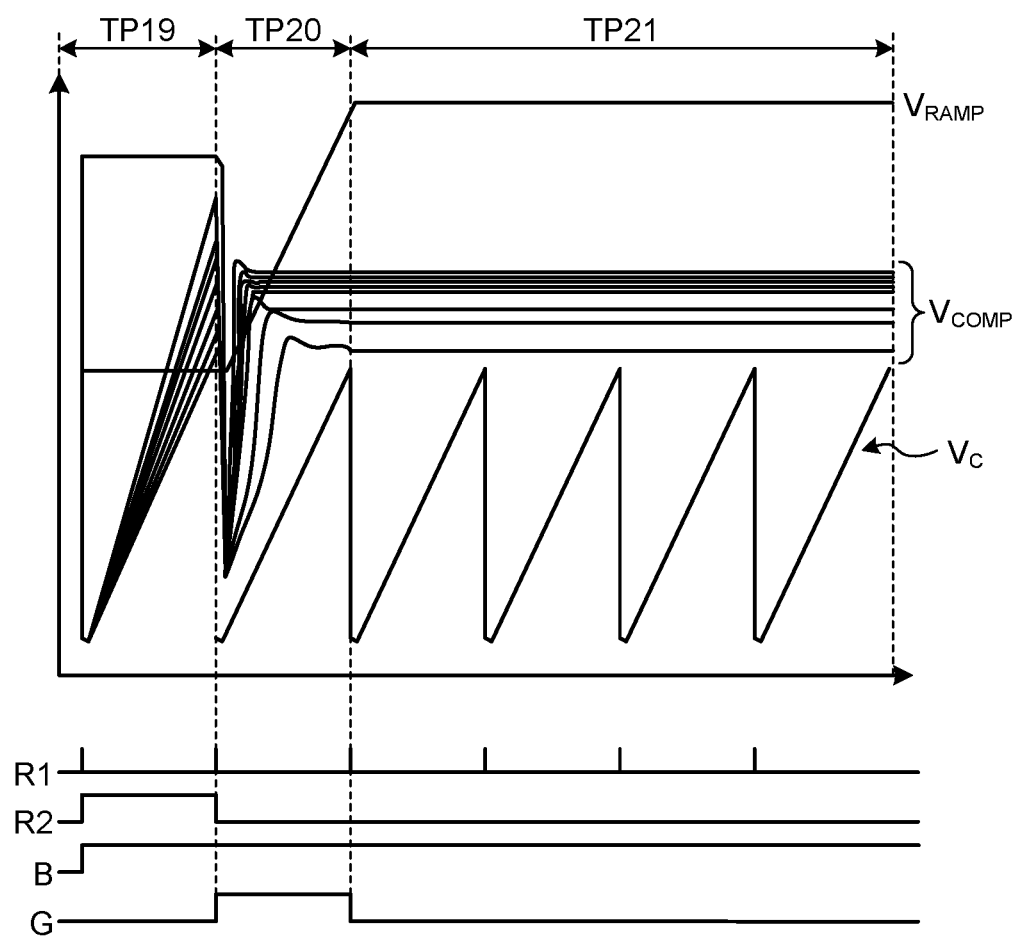
FIG. 12 is a waveform diagram illustrating an operation of the DA converter in the third embodiment.

For example, FIG. 12 illustrates a waveform diagram as results of simulating the state of the compensation and a subsequent operation for the plurality of rows of DA converters 202. FIG. 12 illustrates that although the change rate of the voltage $V_C$ during charge storage varies among the capacitive elements C of the respective rows in a period TP19 before the compensation (no compensation), the capacitive elements C of the respective rows have the same change rate of the voltage $V_C$ during charge storage in a period TP21 of the operation by performing the compensation in the period TP20. In the period TP20 of the compensation, the voltages $V_{COMP}$ in the plurality of rows of DA converters 202 can be adjusted to different values according to variations in the capacitance value of the capacitive element C and variations in the current value of the variable current source CS. Accordingly, the plurality of rows of DA converters 202 can increase the voltage Vc of the capacitive elements C in the charge storage period at the equal and appropriate change rate. A value of the voltage $V_{COMP}$ adjusted through the compensation is maintained substantially constant in the period TP21 of the subsequent operation. Thus, it is possible to maintain the state in which the capacitive elements C of the respective rows have the same change rate of the voltage $V_C$.

As described above, in the third embodiment, in the semiconductor integrated circuit 210, the global circuit 5 generates the reference voltage $V_{RAMP}$ corresponding to the appropriate increase rate, and the DA converter 202 of each row corrects the current value of the current source according to the reference voltage $V_{RAMP}$. At this time, the inverter INV drives a signal output from the differential amplifier circuit DF and transmits the driven signal to the node N3 with the switch G maintained in an on state. Accordingly, it is possible to transmit, at high speed, a change in the level of the signal output from the differential amplifier circuit DF to the node N3 and increase the speed of the feedback operation when the feedback loop of the output node of the differential amplifier circuit DF→the node N3→the variable current source CS200i→the node N1→the inverting input node of the differential amplifier circuit DF is formed. As a result, it is possible to bring the increase rate of the voltage $V_C$ of the capacitive element C in the charge storage period close to the appropriate value at high speed in the DA converter 202 of each row.

Fourth Embodiment

Next, an arithmetic system 1c according to a fourth embodiment will be described. Hereinbelow, differences form the first to third embodiments will be mainly described. The arithmetic system 1c according to the fourth embodiment includes a semiconductor integrated circuit 310 including a plurality of DA converters 302.

In the DA converters (SCIDACs) 2 of the respective rows described in the first embodiment as an example, the completions of the count operations of the local up counters 61 are synchronized with each other to synchronize the completions of the storage of charges in the capacitive elements C. For example, if the frequency of the counter clock CLKC is increased, the speed of DA conversion can be improved, but power consumption may increase. In order to suppress the increase in power consumption, it is desirable to improve the speed of DA conversion while keeping the frequency of the counter clock CLKC low.

Thus, in the fourth embodiment, a bit group of a digital signal to be DA-converted is divided or splitted into a higher-order bit group and a lower-order bit group, and the higher-order bit group and the lower-order bit group are DA-converted in parallel to achieve both reduction in the frequency of the counter clock CLKC and improvement in the speed of DA conversion.

Figure 13:
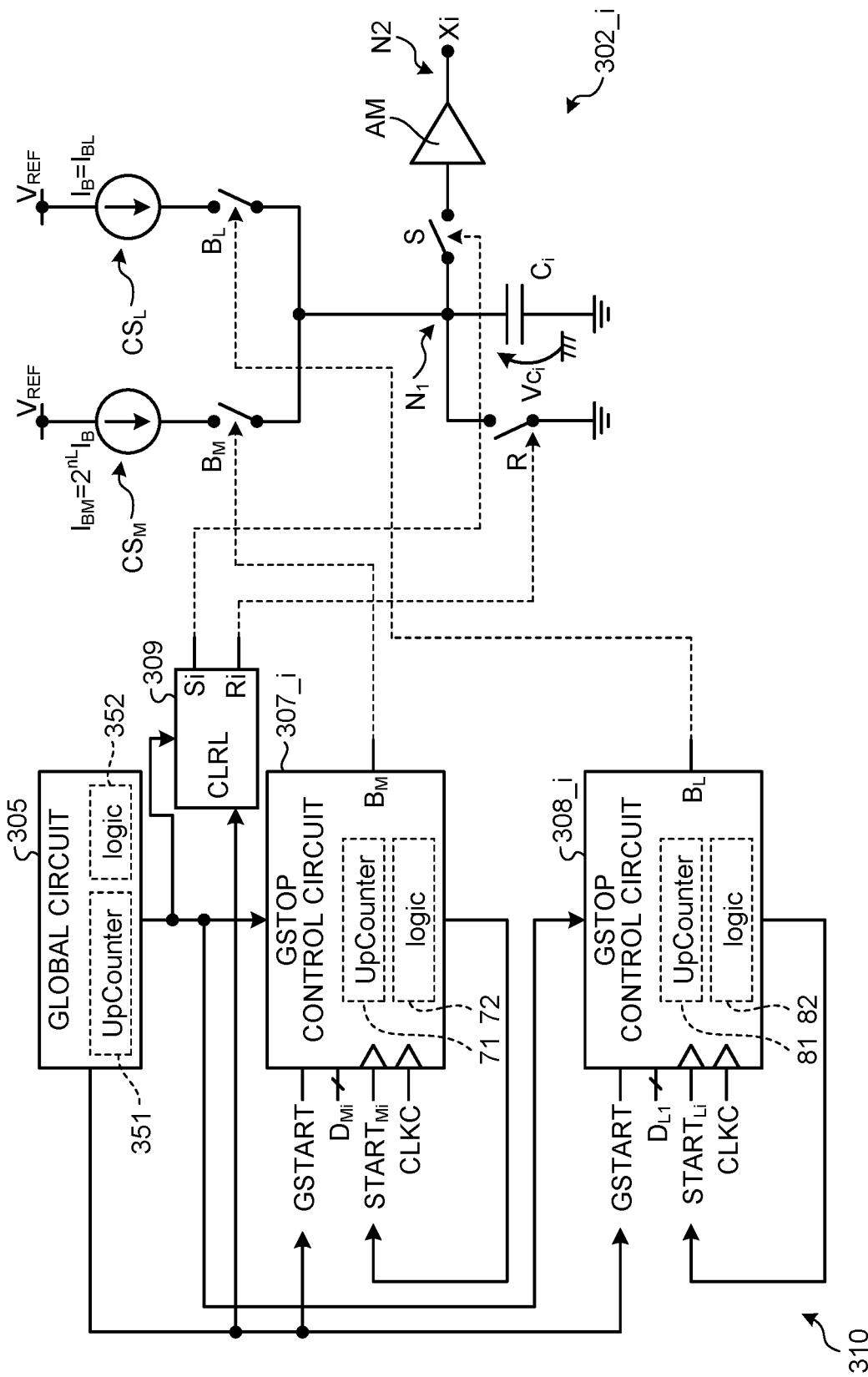
FIG. 13 is a circuit diagram illustrating a configuration of a DA converter in a fourth embodiment.

Specifically, the DA converter 302 of each row in the semiconductor integrated circuit 310 can be configured as illustrated in FIG. 13. FIG. 13 is a circuit diagram illustrating a configuration of the DA converter (SCIDAC) 302. Although FIG. 13 illustrates a configuration of the DA converter 302_i of the i-th row as an example, the same applies to the DA converters 302_i+1 to 302_i+3 of the other rows. FIG. 13 illustrates, as an example, a case where, for the number of bits N of a digital signal $D_i$, the number of bits $n_M$ of a higher-order bit group $D_{Mi}$ and the number of bits $n_L$ of a lower-order bit group $D_{Li}$ satisfy $n_L = n_M = N/2$.

The semiconductor integrated circuit 310 includes a global circuit 305 and the plurality of rows of DA converters 302_i to 302_i+3 instead of the global circuit 5 and the plurality of rows of DA converters 2_i to 2_i+3 (refer to FIG. 2). The global circuit 305 includes a global up counter 351 and a global logic circuit 352. The number of bits of a maximum count value of the global up counter 351 represented as a binary number corresponds to the number of bits $n_M$ of the higher-order bit group $D_{Mi}$ and the number of bits $n_L$ of the lower-order bit group $D_{Li}$ and is, for example, N/2 bits. A minimum value of the global up counter 351 corresponds to a minimum value of the higher-order bit group $D_{Mi}$ and a minimum value of the lower-order bit group $D_{Li}$ and is, for example, zero. A maximum value of the global up counter 351 corresponds to a maximum value of the higher-order bit group $D_{Mi}$ and a maximum value of the lower-order bit group $D_{Li}$ and is, for example, $2^{N/2}$.

The DA converter 302_i includes a current source $CS_M$, a current source $CS_L$, a control circuit 307_i, a control circuit 308_i, a control circuit 309, a switch $B_M$, and a switch $B_L$ instead of the current source CS, the control circuit 6_i, and the switch B (refer to FIG. 3). The current source $CS_M$, the control circuit 307_i, and the switch $B_M$ correspond to the higher-order bit group $D_{Mi}$, and the current source $CS_L$, the control circuit 308_i, and the switch $B_L$ correspond to the lower-order bit group $D_{Li}$. Each of the switch $B_M$ and the switch $B_L$ may be configured with an electrical element such as a transistor.

The current source $CS_M$ is electrically connected between a voltage $V_{REF}$ and the switch $B_M$. The current source $CS_M$ generates a current value $I_{BM}$ corresponding to the higher-order bit group $D_{Mi}$. The current source $CS_M$ generates, for example, $I_{BM} = 2^{n_L} I_B$. The current source $CS_M$ has a first end connected to the voltage $V_{REF}$ and a second end connected to a first end of the switch $B_M$.

The current source $CS_L$ is electrically connected between the voltage $V_{REF}$ and the switch $B_L$. The current source $CS_L$ generates a current value $I_{BL}$ corresponding to the lower-order bit group $D_{Li}$. The current source $CS_L$ generates, for example, $I_{BL} = I_B$. The current source $CS_M$ has a first end connected to the voltage $V_{REF}$ and a second end connected to a first end of the switch $B_L$.

The switch $B_M$ is electrically connected between the current source $CS_M$ and a node N1. The switch $B_M$ has a first end connected to the current source $CS_M$, a second end connected to the node N1, and a control end connected to the control circuit 307_i. The switch $B_M$ is turned on when receiving a control signal $B_{Mi}$ of active level from the control circuit 307_i to connect the current source $CS_M$ to the node N1. The switch $B_M$ is turned off when receiving the control signal $B_{Mi}$ of non-active level from the control circuit 307_i to electrically isolate the current source $CS_M$ from the node N1.

The switch $B_L$ is electrically connected between the current source $CS_L$ and the node N1. The switch $B_L$ has a first end connected to the current source $CS_L$, a second end connected to the node N1, and a control end connected to the control circuit 308_i. The switch $B_L$ is turned on when receiving a control signal $B_{Li}$ of active level from the control circuit 308_i to connect the current source $CS_L$ to the node N1. The switch $B_L$ is turned off when receiving the control signal $B_{Li}$ of non-active level from the control circuit 308_i to electrically isolate the current source $CS_L$ from the node N1.

The control circuit 307_i receives the higher-order bit group $D_{Mi}$ of the digital signals $D_i$ from the outside and receives a global start signal GSTART, a global stop signal GSTOP, and a counter clock CLKC from the global circuit 305. The control circuit 307_i generates the control signal $B_{Mi}$ in response to the higher-order bit group $D_{Mi}$, the global start signal GSTART, the global stop signal GSTOP, and the counter clock CLKC.

The control circuit 307_i includes a local up counter 71 and a local logic circuit 72. The number of bits of a maximum count value of the local up counter 71 represented as a binary number corresponds to the number of bits of the higher-order bit group $D_{Mi}$ and is, for example, N/2 bits. A minimum value of the local up counter 71 corresponds to the minimum value of the higher-order bit group $D_{Mi}$ and is, for example, zero. A maximum value of the local up counter 71 corresponds to the maximum value of the higher-order bit group $D_{Mi}$ and is, for example, $2^{N/2}$. The local up counter 71 is connected to the global circuit 305. The local up counter 71 receives the digital signal $D_i$ from the outside and receives the global start signal GSTART, the global stop signal GSTOP, and the counter clock CLKC from the global circuit 305. The local up counter 71 performs a count operation in response to the global start signal GSTART, the global stop signal GSTOP, and the counter clock CLKC. The local logic circuit 72 generates the control signal $B_{Mi}$ according to the count value of the local up counter 71.

The control circuit 307_i supplies the control signal $B_{Mi}$ to the control end of the switch $B_M$. Accordingly, the control circuit 307_i controls the switch $B_M$.

The control circuit 308_i receives the lower-order bit group $D_{Li}$ of the digital signals $D_i$ from the outside and receives the global start signal GSTART, the global stop signal GSTOP, and the counter clock CLKC from the global circuit 305. The control circuit 308_i generates the control signal $B_{Li}$ in response to the lower-order bit group $D_{Li}$, the global start signal GSTART, the global stop signal GSTOP, and the counter clock CLKC.

The control circuit 308_i includes a local up counter 81 and a local logic circuit 82. The number of bits of a maximum count value of the local up counter 81 represented as a binary number corresponds to the number of bits of the lower-order bit group $D_{Li}$ and is, for example, N/2 bits. A minimum value of the local up counter 81 corresponds to the minimum value of the lower-order bit group $D_{Li}$ and is, for example, zero. A maximum value of the local up counter 81 corresponds to the maximum value of the lower-order bit group $D_{Li}$ and is, for example, $2^{N/2}$. The local up counter 81 is connected to the global circuit 305. The local up counter 81 receives the lower-order bit group $D_{Li}$ from the outside and receives the global start signal GSTART, the global stop signal GSTOP, and the counter clock CLKC from the global circuit 305. The local up counter 81 performs a count operation in response to the global start signal GSTART, the global stop signal GSTOP, and the counter clock CLKC. The local logic circuit 82 generates the control signal $B_{Li}$ according to the count value of the local up counter 81.

The control circuit 308_i supplies the control signal $B_{L1}$ to the control end of the switch $B_M$. Accordingly, the control circuit 308_i controls the switch $B_L$.

The control circuit 309 receives the global start signal GSTART and the global stop signal GSTOP from the global circuit 305. The control circuit 309 generates a control signal $R_i$ and a control signal $S_i$ in response to the global start signal GSTART and the global stop signal GSTOP. The control circuit 309 may be common among the plurality of rows (the i-th to (i+3)-th rows).

Next, an operation of the semiconductor integrated circuit 310 will be described. In the semiconductor integrated circuit 310, operations as illustrated in FIGS. 14A to 14C are performed. Although FIGS. 14A to 14C illustrate the operations of the global circuit 305 and the DA converter 302_i of the i-th row as an example, the same applies to the DA converters 302_i+1 to 302_i+3 of the other rows. FIG. 14A illustrates count values of the global up counter 351 and the local up counters 71 and 81 of each row. FIG. 14B illustrates level transition timings of the global start signal GSTART, the global stop signal GSTOP, and the local start signals $START_{Li}$ and $START_{Mi}$ and the control signals $R_i$, $B_{Li}$, $B_{Mi}$, and $S_i$ of the i-th row. FIG. 14C illustrates a voltage $V_{Ci}$ stored in the capacitive element $C_i$.

As illustrated in FIGS. 14A and 14B, an initialization process is performed immediately before a conversion period $T_{200}$. The minimum value (e.g., zero) is set to the global up counter 351, the higher-order bit group $D_{Mi}$ is set to the local up counter 71 of the i-th row, and the lower-order bit group $D_{Li}$ is set to the local up counter 81 of the i-th row.

Upon start of the conversion period $T_{200}$, a DA conversion process is started. The global up counter 351, the local up counter 71, and the local up counter 81 simultaneously start counting up in synchronization with the counter clock CLKC having a frequency $f_{CLKC}$.

The local logic circuit 72 of the i-th row and the local logic circuit 82 of the i-th row perform the following operations independently of each other. When the count value of the local up counter 71 reaches the maximum value (e.g., $2^{N/2}$), the local logic circuit 72 resets the count value of the local up counter 71 to the minimum value and causes the local up counter 71 to restart counting up, and turns on the switch $B_M$. Accordingly, the storage of charges in the capacitive element $C_i$ using a current from the current source $CS_M$ is started. Similarly, when the count value of the local up counter 81 reaches the maximum value (e.g., $2^{N/2}$), the local logic circuit 82 resets the count value of the local up counter 81 to the minimum value and causes the local up counter 81 to restart counting up, and turns on the switch $B_L$. Accordingly, the storage of charges in the capacitive element $C_i$ using a current from the current source $CS_L$ is started.

When the count value of the global up counter 351 reaches the maximum value (e.g., $2^{N/2}$), the global logic circuit 352 instructs the local up counter 71 and the local up counter 81 to finish counting. The local up counter 71 and the local up counter 81 stop their respective count operations. The local logic circuit 72 turns off the switch $B_M$ in response to the stop of the count operation of the local up counter 71. Accordingly, the storage of charges in the capacitive element $C_i$ using the current from the current source $CS_M$ is completed. Similarly, the local logic circuit 82 turns off the switch $B_L$ in response to the stop of the count operation of the local up counter 81. Accordingly, the storage of charges in the capacitive element $C_i$ using the current from the current source $CS_L$ is completed. As a result, the voltage $V_{Ci}$ of the capacitive element $C_i$ is as represented by the following formula 12.

$$V_C = \frac{I_B}{f_{CLKC} C}\left(2^{nL} D_M + D_L\right) \qquad \text{Formula 12}$$

In formula 12, a subscript indicating the i-th row is omitted for the sake of simplification. $V_C$ denotes the voltage of the capacitive element $C_i$. $I_B$ is a unit current value of the current source. $f_{CLKC}$ is the frequency of the counter clock. C is a capacitance value of the capacitive element $C_i$. nL is the number of bits of the lower-order bit group $D_{Li}$. $D_M$ denotes a value of the higher-order bit group $D_{Mi}$. $D_L$ denotes a value of the lower-order bit group $D_{Li}$. Comparing formula 12 with formula 1 of the first embodiment, the following formula 13 is obtained when the value of the digital signal to be DA-converted and the voltage to be stored in the capacitive element $C_i$ are the same between the first and fourth embodiments.

$$V_C = V'_C; \; \frac{I_B}{f_{CLKC} C}\left(2^{nL} D_M + D_L\right) = \frac{I'_B D}{f'_{CLKC} C} \qquad \text{Formula 13}$$

In formula 13, $V_{C'}$ denotes the voltage of the capacitive element $C_i$ in the first embodiment. $I_{B'}$ is the current value of the current source CS in the first embodiment. $f_{CLKC'}$ is the frequency of the counter clock in the first embodiment.

Since the value of the digital signal to be DA-converted is the same between the first and fourth embodiments, the following formula 14 holds.

$$2^{nL} D_M + D_L = D \qquad \text{Formula 14}$$

The following formula 15 holds from formulae 13 and 14.

$$\frac{I_B}{I'_B} = \frac{f_{CLKC}}{f'_{CLKC}} \qquad \text{Formula 15}$$

As shown in formula 15, the frequency of the counter clock can be kept low by reducing the unit current value $I_B$ of the current source illustrated in FIG. 13. For example, it is assumed that the number of bits of the digital signal D is N=8, and the number of bits $n_M$ of the higher-order bit group $D_{Mi}$ and the number of bits $n_L$ of the lower-order bit group $D_{Li}$ are $n_L=n_M=N/2=4$. In this case, the frequency $f_{CLKC}$ of the counter clock can be reduced to $½^4$ of the frequency $f_{CLKC'}$ of the counter clock in the first embodiment. However, in this case, the unit current value $I_B$ of the current source illustrated in FIG. 13 is reduced to $½^4$.

For example, in the case of FIG. 14A, immediately before timing t30, the global circuit 305 sets the minimum value (e.g., zero) to the global up counter 351, the control circuit 307_i of the i-th row sets a value of the higher-order bit group $D_{Mi}$ to the local up counter 71, and the control circuit 308_$i$ sets a value of the lower-order bit group $D_{Li}$ to the local up counter 81.

At this time, the local logic circuits 71 and 81 respectively supply, to the switch $B_M$ and the switch $B_L$, the control signal $B_{Mi}$ and the control signal $B_{Li}$ which are maintained at non-active level. The control circuit 309 supplies, to the switch R and the switch S, the control signal $R_i$ and the control signal $S_i$ which are maintained at non-active level. Accordingly, in the DA converter 302_$i$, the switch R, the switch $B_M$, the switch $B_L$, and the switch S are all maintained in an off state.

At the timing t30, the control circuit 309 causes the control signal $R_i$ to transition from non-active level to active level. Accordingly, in the DA converter 302_$i$, the switch R is turned on.

In a period from the timing t30 to timing t31, the local logic circuits 71 and 81 respectively maintain the control signal $B_{Mi}$ and the control signal $B_{Li}$ at non-active level. The control circuit 309 maintains the control signal $R_i$ at active level while maintaining the control signal $S_i$ at non-active level. Accordingly, in the DA converter 302_$i$, the switch R is maintained in an on state while the switch $B_M$, the switch $B_L$, and the switch S are maintained in an off state, charges stored in the capacitive element $C_i$ are discharged, and the voltage of the capacitive element $C_i$ is reset.

At the timing t31, the global up counter 351 starts counting up from the minimum value as indicated by a chain double-dashed line in FIG. 14A. In response to this, as illustrated in FIG. 14B, the global logic circuit 352 causes the global start signal GSTART to transition from non-active level to active level. The global logic circuit 352 supplies the global start signal GSTART to the local up counters 71 and 81. In response to the global start signal GSTART becoming active level, the local up counter 71 starts counting up from a value of the higher-order bit group $D_{Mi}$ as indicated by a dot-dash line in FIG. 14A. In response to the global start signal GSTART becoming active level, the local up counter 81 starts counting up from a value of the lower-order bit group $D_{Li}$ as indicated by a solid line in FIG. 14A. The global up counter 351, and the local up counters 71 and 81 count up in synchronization with the counter clock CLKC.

At this time, the control circuit 309 causes the control signal $R_i$ to transition from active level to non-active level. Accordingly, in the DA converter 302_$i$, the switch R is turned off, and the reset of the voltage of the capacitive element Ci is completed.

Focusing on the lower-order bit group, in a period from the timing t31 to timing t32, the local up counter 81 counts up in synchronization with the counter clock CLKC as indicated by the solid line in FIG. 14A. In response to this, the local logic circuit 82 maintains the control signal $B_{Li}$ at non-active level. Accordingly, in the DA converter 302_$i$, the switch $B_L$ is maintained in an off state.

As indicated by the solid line in FIG. 14A, when the count value of the local up counter 81 reaches the maximum value at the timing t32, the control circuit 308_$i$ resets the count value of the local up counter 81 from the maximum value to the minimum value. In addition, the control circuit 308_$i$ causes the local start signal $START_{Li}$ for the lower-order bit group to transition from non-active level to active level. In response to this, the local up counter 81 starts counting up from the minimum value as indicated by the solid line in FIG. 14A. The local up counter 81 counts up in synchronization with the counter clock CLKC.

In response to the local start signal $START_{Li}$ becoming active level, the local logic circuit 82 changes the control signal $B_{Li}$ from non-active level to active level and supplies the control signal $B_{Li}$ to the switch $B_L$. Accordingly, in the DA converter 302_$i$, the switch $B_L$ is turned on, and the storage of charges in the capacitive element $C_i$ using the current source $CS_L$ is started.

In a period from the timing t32 to timing t34, as indicated by the solid line in FIG. 14A, the local up counter 81 counts up in synchronization with the counter clock CLKC. In this period, the local logic circuit 82 maintains the control signal $B_{Li}$ at active level. Accordingly, in the DA converter 302_$i$, the switch $B_L$ is maintained in an on state, and the storage of charges in the capacitive element $C_i$ using the current source $CS_L$ is performed.

On the other hand, focusing on the higher-order bit group, in a period from the timing t31 to timing t33, the local up counter 71 counts up in synchronization with the counter clock CLKC as indicated by the dot-dash line in FIG. 14A. In response to this, the local logic circuit 72 maintains the control signal $B_{Mi}$ at non-active level. Accordingly, in the DA converter 302_$i$, the switch $B_M$ is maintained in an off state.

As indicated by the dot-dash line in FIG. 14A, when the count value of the local up counter 71 reaches the maximum value at the timing t33, the control circuit 307_$i$ resets the count value of the local up counter 71 from the maximum value to the minimum value. In addition, the control circuit 307_$i$ causes the local start signal $START_{Mi}$ for the higher-order bit group to transition from non-active level to active level. In response to this, the local up counter 71 starts counting up from the minimum value as indicated by the dot-dash line in FIG. 14A. The local up counter 71 counts up in synchronization with the counter clock CLKC.

In response to the local start signal $START_{Mi}$ becoming active level, the local logic circuit 72 of the i-th row changes the control signal $B_{Mi}$ from non-active level to active level and supplies the control signal $B_{Mi}$ to the switch $B_M$. Accordingly, in the DA converter 302_$i$, the switch $B_M$ is turned on. At this time, the storage of charges in the capacitive element $C_i$ using the current source $CS_L$ has already been started. In addition to this, the storage of charges in the capacitive element $C_i$ using the current source $CS_M$ is started.

In a period from the timing t33 to the timing t34, as indicated by the dot-dash line in FIG. 14A, the local up counter 71 counts up in synchronization with the counter clock CLKC. In this period, the local logic circuit 72 maintains the control signal $B_{Mi}$ at active level. Accordingly, in the DA converter 302_$i$, the switch $B_M$ is maintained in an on state, and the storage of charges in the capacitive element $C_i$ using the current source $CS_M$ is performed. At this time, the storage of charges in the capacitive element $C_i$ using the current source $CS_L$ is also performed.

At the timing t34, as indicated by the chain double-dashed line in FIG. 14A, the count value of the global up counter 351 reaches the maximum value. In response to this, as illustrated in FIG. 14B, the global logic circuit 352 causes the global stop signal GSTOP to transition from non-active level to active level. The global logic circuit 352 supplies the global stop signal GSTOP to the local up counters 71 and 81. In response to the global stop signal GSTOP becoming active level, the local up counter 71 finishes counting up, for example, at a value of the higher-order bit group $D_{Mi}$ as indicated by the dot-dash line in FIG. 14A. In response to the global stop signal GSTOP becoming active level, the local up counter 81 finishes counting up, for example, at a value of the lower-order bit group $D_{Li}$ as indicated by the solid line in FIG. 14A.

At this time, the local logic circuits 72 and 82 respectively cause the control signal $B_{Mi}$ and the control signal $B_{Li}$ to transition from active level to non-active level. The control circuit 309 causes the control signal $S_i$ to transition from non-active level to active level. Accordingly, in the DA converter 302_i, the switch $B_M$ and $B_L$ are turned off to complete the storage of charges in the capacitive element $C_i$, and the voltage of the capacitive element $C_i$ is output to the amplifier circuit AM.

In a period after the timing t34, the control circuit 309 maintains the control signal $S_i$ at active level while maintaining the control signal $R_i$ at non-active level. Accordingly, in the DA converter 302_i, the switch S is maintained in an on state while the switch R is maintained in an off state, and the voltage of the capacitive element $C_i$ is amplified by the amplifier circuit AM and output as an analog signal $X_i$.

Focusing on an increase rate of the voltage $V_{Ci}$ of the capacitive element $C_i$, as illustrated in FIG. 14C, in the period from the timing t32 to the timing t34, the storage of charges in the capacitive element $C_i$ is performed with the current $I_{BL}$ supplied by the current source $CS_L$, and the voltage $V_{Ci}$ increases at an increase rate (gradient) corresponding to the current $I_{BL}$. Further, in the period from the timing t33 to the timing t34, the storage of charges in the capacitive element $C_i$ is additionally performed with the current $I_{BM}$ supplied by the current source $CS_M$, and the voltage $V_{Ci}$ increases at the increase rate with an increase rate (gradient) corresponding to the current $I_{BM}$ added. The storage of charges in the capacitive element $C_i$ using the current $I_{BL}$ supplied by the current source $CS_L$ and the storage of charges in the capacitive element $C_i$ using the current $I_{BM}$ supplied by the current source $CS_M$ are equivalently performed in parallel. Thus, the storage of charges in the capacitive element $C_i$ can be performed at high speed.

As described above, in the fourth embodiment, the bit group of the digital signal to be DA-converted is divided or splitted into the higher-order bit group and the lower-order bit group, and the higher-order bit group and the lower-order bit group are DA-converted in parallel. This makes it possible to achieve both reduction in the frequency of the counter clock CLKC and improvement in the speed of DA conversion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a global circuit; and
   a plurality of DA converters connected to the global circuit,
   each of the plurality of DA converters including
      a current source,
      a capacitive element having a first end and a second end, the second end being connected to a node of a reference potential of the DA converter,
      an amplifier circuit having an input node,
      a first switch element having a first end connected to the current source and a second end connected to the first end of the capacitive element,
      a second switch element having a first end connected to the first end of the capacitive element and a second end connected to the node of the reference potential,
      a third switch element having a first end connected to the first end of the capacitive element and a second end connected to the input node of the amplifier circuit, and
      a control circuit configured to maintain the second switch element in an on state while maintaining the first switch element and the third switch element both in an off state in a first period, and to maintain the first switch element in an on state while maintaining the second switch element and the third switch element both in an off state in a second period after the first period, wherein
      end timings of the second period in the plurality of DA converters are synchronized with each other in response to a signal received from the global circuit.

2. The semiconductor integrated circuit according to claim 1, wherein
   the control circuit is configure to maintain the first switch element, the second switch element, and the third switch element in an off state in a third period between the first period and the second period.

3. The semiconductor integrated circuit according to claim 2, wherein
   the control circuit is further configure to maintain the third switch element in an on state while maintaining the first switch element and the second switch element in an off state in a fourth period after the second period.

4. The semiconductor integrated circuit according to claim 2, wherein
   the global circuit includes a global counter, and is configure to output a start signal at start of counting of the global counter and to output a stop signal at finish of counting of the global counter, and
   the control circuit includes a local counter connected to the global circuit, and the local counter is configure to count up from a value of an input digital signal to a maximum value in the third period that starts in response to the start signal received from the global circuit and to count up from a minimum value to the value of the input digital signal in the second period that starts in response to a count value of the local counter reaching the maximum value and ends in response to the stop signal received from the global circuit.

5. The semiconductor integrated circuit according to claim 2, wherein
   start timings of the third period in the plurality of DA converters are synchronized with each other, and start timings of the second period in the plurality of DA converters are not synchronized with each other.

6. The semiconductor integrated circuit according to claim 2, wherein
   a total length of the third period and the second period is substantially equal among the plurality of DA converters.

7. The semiconductor integrated circuit according to claim 1, wherein
   start timings of the second period in the plurality of DA converters are not synchronized with each other.

8. A semiconductor integrated circuit comprising:
   a global circuit; and
   a plurality of DA converters connected to the global circuit, each of the plurality of DA converters including
a variable current source having a control end,
a first capacitive element having a first end connected to a first node and a second end connected to a node of a reference potential of the DA converter,
a second capacitive element having a first end connected to the control end of the variable current source and a second end connected to a node of a power supply potential of the DA converter,
a differential amplifier circuit having a first input node to which a reference signal is supplied from the global circuit, a second input node connected to the first node, and an output node,
a first switch element having a first end connected to the first node and a second end connected to the node of the reference potential,
a second switch element having a first end connected to the control end of the variable current source and a second end connected to the node of the power supply potential,
a third switch element having a first end connected to the control end of the variable current source and a second end connected to the output node of the differential amplifier circuit, and
a fourth switch element having a first end connected to the variable current source and a second end connected to the first node.

9. The semiconductor integrated circuit according to claim 8, further comprising
an inverter connected between the differential amplifier circuit and the third switch element.

10. The semiconductor integrated circuit according to claim 9, wherein
the inverter includes a first transistor and a second transistor, the first transistor and the second transistor being inverter-connected between the differential amplifier circuit and the third switch element.

11. The semiconductor integrated circuit according to claim 8, further comprising:
an amplifier circuit having an input node; and
a fifth switch element having a first end connected to the first node and a second end connected to the input node of the amplifier circuit.

12. The semiconductor integrated circuit according to claim 8, wherein
each of the plurality of DA converters further includes a control circuit configured, in a first period, to maintain the first switch element and the second switch element both in an on state while maintaining the third switch element and the fourth switch element both in an off state, and in a second period after the first period, to maintain the third switch element and the fourth switch element both in an on state while maintaining the first switch element and the second switch element both in an off state.

13. The semiconductor integrated circuit according to claim 8, wherein
the variable current source includes series connection of a first transistor and a second transistor between the node of the power supply potential and the fourth switch element.

14. The semiconductor integrated circuit according to claim 13, wherein
the first transistor has a gate connected to the first end of the second capacitive element, a source connected to the node of the power supply, and a drain connected to the second transistor, and
the second transistor has a gate to which a bias voltage is supplied, a source connected to the first transistor, and a drain to which the fourth switch is connected.

15. An arithmetic system comprising:
the semiconductor integrated circuit according to claim 1, the semiconductor integrated circuit being configured to generate a plurality of first signals;
a plurality of multiplier elements configured to multiply the plurality of first signals by weights independent of each other to generate a plurality of calculation results, the multiplier elements being arranged to constitute a plurality of rows and a plurality of columns; and
a plurality of adder elements configured to calculate, for each of the plurality of columns, a sum of calculation results of each column among the plurality of calculation results to generate a plurality of second signals.

16. The arithmetic system according to claim 15, wherein
the control circuit is configured to maintain the first switch element, the second switch element, and the third switch element in an off state in a third period between the first period and the second period.

17. The arithmetic system according to claim 15, wherein
start timings of the second period in the plurality of DA converters are not synchronized with each other.

18. An arithmetic system comprising:
the semiconductor integrated circuit according to claim 10, the semiconductor integrated circuit being configured to generate a plurality of first signals;
a plurality of multiplier elements configured to multiply the plurality of first signals by weights independent of each other to generate a plurality of calculation results, the multiplier elements being arranged to constitute a plurality of rows and a plurality of columns; and
a plurality of adder elements configured to calculate, for each of the plurality of columns, a sum of calculation results of each column among the plurality of calculation results to generate a plurality of second signals.

19. The arithmetic system according to claim 18, wherein
the semiconductor integrated circuit further includes an inverter connected between the differential amplifier circuit and the third switch element.

20. The arithmetic system according to claim 18, wherein
each of the plurality of DA converters further includes a control circuit configured, in a first period, to maintain the first switch element and the second switch element both in an on state while maintaining the third switch element and the fourth switch element both in an off state, and in a second period after the first period, to maintain the third switch element and the fourth switch element both in an on state while maintaining the first switch element and the second switch element both in an off state.

* * * * *